US012772657B2

(12) United States Patent
Qu

(10) Patent No.: US 12,772,657 B2
(45) Date of Patent: Oct. 20, 2026

(54) LIGHT-EMITTING ELEMENT, DISPLAY DEVICE, AND METHOD OF MANUFACTURING DISPLAY DEVICE

(71) Applicant: Sharp Display Technology Corporation, Kameyama City (JP)

(72) Inventor: Yang Qu, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 421 days.

(21) Appl. No.: 18/288,492

(22) PCT Filed: Jun. 2, 2021

(86) PCT No.: PCT/JP2021/021015
§ 371 (c)(1),
(2) Date: Oct. 26, 2023

(87) PCT Pub. No.: WO2022/254614
PCT Pub. Date: Dec. 8, 2022

(65) Prior Publication Data

US 2024/0381686 A1 Nov. 14, 2024

(51) Int. Cl.
*H10K 50/17* (2023.01)
*H05B 33/10* (2006.01)
*H10K 59/12* (2023.01)

(52) U.S. Cl.
CPC ............ *H10K 50/17* (2023.02); *H05B 33/10* (2013.01); *H10K 59/1201* (2023.02)

(58) Field of Classification Search
CPC .. H10K 50/17; H10K 59/1201; H10K 50/115; H10K 59/32; H05B 33/10; H05B 33/12; H05B 33/14
See application file for complete search history.

(56) References Cited

U.S. PATENT DOCUMENTS

| | | | | |
|---|---|---|---|---|
| 7,122,254 | B2 * | 10/2006 | Beierlein | H10K 50/826 428/917 |
| 11,031,570 | B2 * | 6/2021 | Mishima | H10K 71/135 |
| 2020/0091265 | A1 * | 3/2020 | Matsuki | H10K 59/124 |
| 2021/0066673 | A1 * | 3/2021 | Zhang | H10K 71/441 |
| 2021/0234100 | A1 | 7/2021 | Jin et al. | |

FOREIGN PATENT DOCUMENTS

| | | | |
|---|---|---|---|
| CN | 111509131 | A | 8/2020 |
| JP | 2003-142079 | A | 5/2003 |
| JP | 2018-024535 | A | 2/2018 |
| JP | 2019-522367 | A | 8/2019 |

* cited by examiner

*Primary Examiner* — Yara B Green
*Assistant Examiner* — Benjamin Michael Kupp
(74) *Attorney, Agent, or Firm* — ScienBiziP, P.C.

(57) ABSTRACT

A light-emitting element includes an anode, a cathode, a light-emitting layer provided between the anode and the cathode, and a hole injection layer made of nickel hydroxide, the hole injection layer being provided between the anode and the light-emitting layer.

12 Claims, 20 Drawing Sheets

(a)

(b)

LIGHT-EMITTING ELEMENT, DISPLAY DEVICE, AND METHOD OF MANUFACTURING DISPLAY DEVICE

TECHNICAL FIELD

The disclosure relates to a light-emitting element, a display device, and a method of manufacturing the display device.

BACKGROUND ART

In recent years, various display devices provided with light-emitting elements are developed. In particular, a display device provided with a quantum dot light-emitting diode (QLED), or an organic light-emitting diode (OLED) attracts a great deal of attention from perspectives such as the capability to achieve lower power consumption, a slimmer design, and higher picture quality.

In general, in the case of QLEDs or OLEDs, organic hole injection materials such as PEDOT:PSS are used as hole injection layers, and organic hole transport materials are used as hole transport layers. Such an organic hole injection material has a relatively high hole injection capability, and such an organic hole transport material has a relatively high hole transport capability, but there is a problem in reliability because both materials are organic materials.

For this reason, studies on inorganic hole injection materials or inorganic hole transport materials that can be used as hole injection layers or hole transport layers of QLEDs or OLEDs are actively conducted.

For example, JP 2019-522367 T describes a QLED or an OLED including a nickel oxide film as a hole injection layer. By using the nickel oxide film, which is an inorganic material, as the hole injection layer, the reliability of the QLED or the OLED can be improved.

CITATION LIST

Patent Literature

SUMMARY

Technical Problem

However, in a case of a light-emitting element provided with a hole injection layer or a hole transport layer made of a p-type transition metal oxide such as nickel oxide, the nickel oxide does not have satisfactory hole injection capability or hole transport capability in the first place, so that there is a problem that satisfactory light-emitting element characteristics cannot be obtained. Furthermore, since a heat treatment with a high temperature being equal to or higher than 400° C. is required to obtain a nickel oxide film, there is also a problem that it is difficult to directly form a nickel oxide film on a substrate provided with a thin film transistor layer, for example.

One aspect of the disclosure has been made in view of the above problems, and an object thereof is to provide a light-emitting element that has satisfactory reliability and light-emitting element characteristics and that can be formed without requiring a heat treatment with a high temperature being equal to or higher than 400° C., a display device including the light-emitting elements, and a method of manufacturing the display device including the light-emitting elements.

Solution to Problem

In order to solve the problems, a light-emitting element of the disclosure includes an anode, a cathode, a light-emitting layer provided between the anode and the cathode, and a layer made of nickel hydroxide, the layer being provided between the anode and the light-emitting layer.

In order to solve the problems, a display device according to the disclosure includes a substrate, a thin film transistor layer provided on the substrate, and a plurality of the light-emitting elements are provided on the thin film transistor layer, wherein the plurality of the light-emitting elements include a first light-emitting element, a second light-emitting element, and a third light-emitting element, the first light-emitting element includes a first light-emitting layer as the light-emitting layer, the second light-emitting element includes, as the light-emitting layer, a second light-emitting layer having a light-emission peak wavelength different from a light-emission peak wavelength of the first light-emitting layer, and the third light-emitting element includes, as the light-emitting layer, a third light-emitting layer having a light-emission peak wavelength different from the light-emission peak wavelengths of the first light-emitting layer and the second light-emitting layer.

In order to solve the problems, a method of manufacturing a display device according to the disclosure includes forming a thin film transistor layer on a substrate, and forming a light-emitting element on the thin film transistor layer, the light-emitting element including an anode, a cathode, and a light-emitting layer provided between the anode and the cathode, wherein the forming a light-emitting element further includes forming a layer including nickel hydroxide between the anode and the light-emitting layer.

Advantageous Effects of Disclosure

An aspect of the disclosure can provide a light-emitting element that has satisfactory reliability and light-emitting element characteristics and that can be formed without requiring a heat treatment with a high temperature being equal to or higher than 400° C., a display device including the light-emitting element, and a method of manufacturing the display device including the light-emitting element.

DESCRIPTION OF EMBODIMENTS

Embodiments of the disclosure will be described below with reference to FIG. 1 to FIG. 20. Hereinafter, for convenience of description, configurations having the same functions as those described in a specific embodiment are denoted by the same reference signs, and descriptions thereof will be omitted.

First Embodiment

Figure 1:
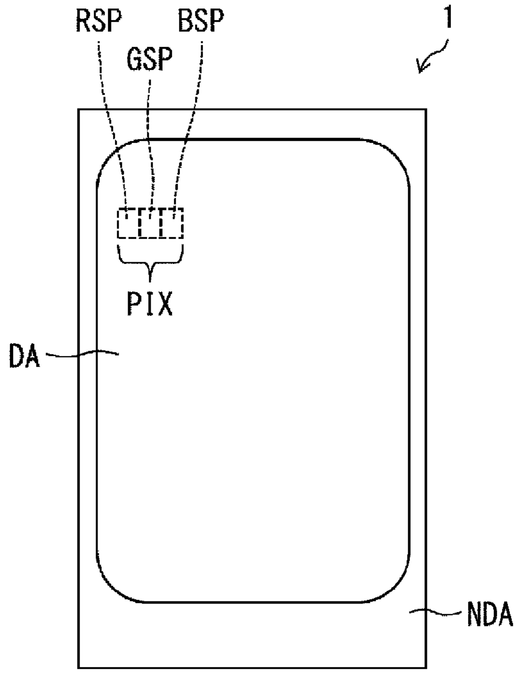
FIG. 1 is a plan view illustrating a schematic configuration of a display device according to a first embodiment.

FIG. 1 is a schematic plan view illustrating a configuration of a display device 1 according to a first embodiment.

As illustrated in FIG. 1, the display device 1 includes a frame region NDA and a display region DA. A plurality of pixels PIX are provided in the display region DA of the display device 1, and each pixel PIX includes a red subpixel RSP, a green subpixel GSP, and a blue subpixel BSP. In the present embodiment, a case will be described as an example in which one pixel PIX includes the red subpixel RSP, the green subpixel GSP, and the blue subpixel BSP, but no such limitation is intended. For example, one pixel PIX may further include a subpixel of another color in addition to the red subpixel RSP, the green subpixel GSP, and the blue subpixel BSP.

Figure 2:
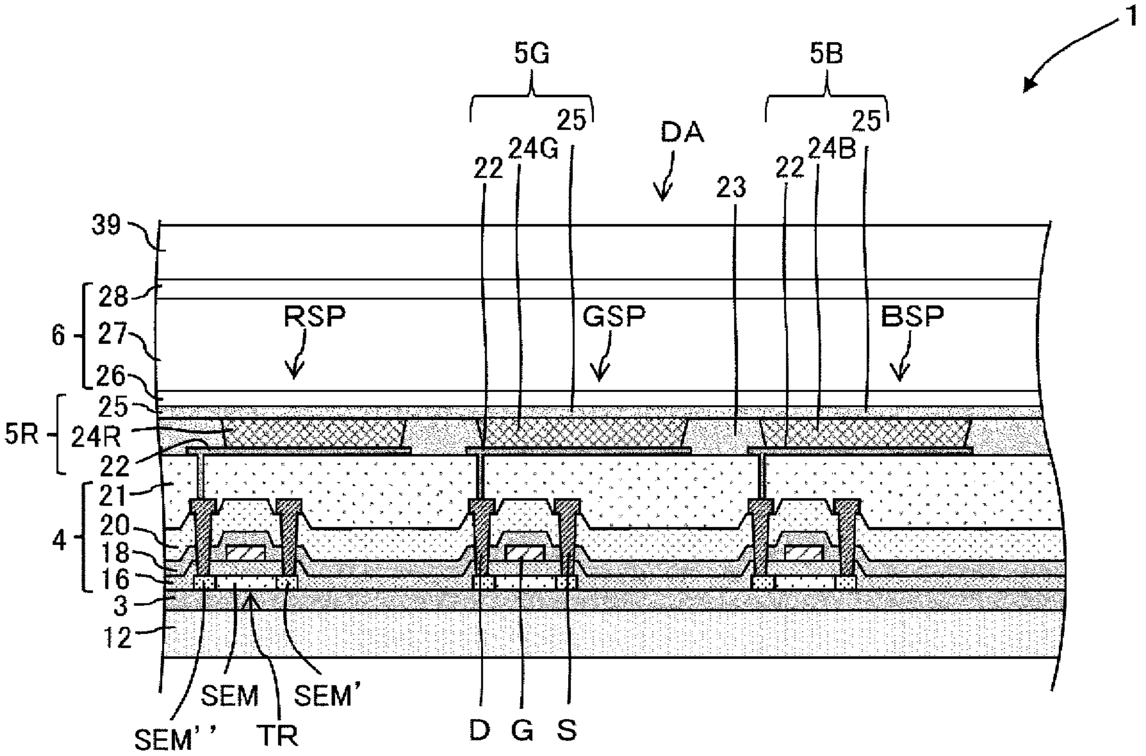
FIG. 2 is a cross-sectional view illustrating a schematic configuration of a display region of the display device according to the first embodiment.

FIG. 2 is a cross-sectional view illustrating a schematic configuration of the display region DA of the display device 1 according to the first embodiment.

As illustrated in FIG. 2, in the display region DA of the display device 1, a barrier layer 3, a thin film transistor layer 4 including transistors TRs, a red light-emitting element 5R, a green light-emitting element 5G, a blue light-emitting element 5B, an edge cover 23, a sealing layer 6, and a function film 39 are provided on a substrate 12 in this order from the substrate 12 side.

The red subpixel RSP provided in the display region DA of the display device 1 includes a red light-emitting element 5R (first light-emitting element), the green subpixel GSP provided in the display region DA of the display device 1 includes a green light-emitting element 5G (second light-emitting element), and the blue subpixel BSP provided in the display region DA of the display device 1 includes a blue light-emitting element 5B (third light-emitting element). The red light-emitting element 5R included in the red subpixel RSP includes an anode 22, a function layer 24R including a red light-emitting layer, and a cathode 25, the green light-emitting element 5G included in the green subpixel GSP includes an anode 22, a function layer 24G including a green light-emitting layer, and the cathode 25, and the blue light-emitting element 5B included in the blue subpixel BSP includes an anode 22, a function layer 24B including a blue light-emitting layer, and the cathode 25.

The substrate 12 may be, for example, a resin substrate made of a resin material such as polyimide, or may be a glass substrate. In the present embodiment, the display device 1 is a flexible display device, and thus a case will be described as an example in which the resin substrate made of the resin material such as polyimide is used as the substrate 12.

However, no such limitation is intended. In a case where the display device 1 is a non-flexible display device, the glass substrate may be used as the substrate 12.

The barrier layer 3 is a layer that inhibits foreign matter, such as water and oxygen, from entering the transistor TR, the red light-emitting element 5R, the green light-emitting element 5G, and the blue light-emitting element 5B, and can be formed of, for example, a silicon oxide film, a silicon nitride film, or a silicon oxynitride film, or a layered film thereof formed by chemical vapor deposition (CVD).

The transistor TR portion of the thin film transistor layer 4 including the transistor TR includes a semiconductor film SEM, doped semiconductor films SEM' and SEM", an inorganic insulating film 16, a gate electrode G, an inorganic insulating film 18, an inorganic insulating film 20, a source electrode S, a drain electrode D, and a flattening film 21. A portion other than the transistor TR portion of the thin film transistor layer 4 including the transistor TR includes the inorganic insulating film 16, the inorganic insulating film 18, the inorganic insulating film 20, and the flattening film 21.

The semiconductor films SEM, SEM' and SEM" may be formed of low-temperature polysilicon (LTPS) or an oxide semiconductor (for example, an In—Ga—Zn—O based semiconductor), for example. In the example of the present embodiment described herein, the transistor TR has a top gate structure. However, no such limitation is intended, and the transistor TR may have a bottom gate structure.

The gate electrode G, the source electrode S, and the drain electrode D may be formed of a single-layer film or a layered film of a metal including, for example, at least one of aluminum, tungsten, molybdenum, tantalum, chromium, titanium, or copper.

The inorganic insulating film 16, the inorganic insulating film 18, and the inorganic insulating film 20 may be formed of a silicon oxide film, a silicon nitride film, or a silicon oxynitride film, or a layered film thereof, formed by CVD.

The flattening film 21 may be formed of coatable organic materials such as polyimide and acrylic.

The red light-emitting element 5R includes the anode 22 that is an upper layer overlying the flattening film 21, the function layer 24R including the red light-emitting layer, and the cathode 25. The green light-emitting element 5G includes the anode 22 that is an upper layer overlying the flattening film 21, the function layer 24G including the green light-emitting layer, and the cathode 25. The blue light-emitting element 5B includes the anode 22 that is an upper layer overlying the flattening film 21, the function layer 24B including the blue light-emitting layer, and the cathode 25. Note that the edge cover 23 with insulating properties covering the edge of the anode 22 is formed, for example, by applying an organic material, such as polyimide or acrylic, and then patterning the organic material by photolithography.

In the present embodiment, a case will be described as an example where the red light-emitting element 5R, the green light-emitting element 5G, and the blue light-emitting element 5B are QLEDs (quantum dot light-emitting diodes), but no such limitation is intended. The red light-emitting element 5R, the green light-emitting element 5G, and the blue light-emitting element 5B may be OLEDs (organic light-emitting diodes), or one or some elements of the red light-emitting element 5R, the green light-emitting element 5G, and the blue light-emitting element 5B may be QLEDs, and the remaining element or elements of the red light-emitting element 5R, the green light-emitting element 5G, and the blue light-emitting element 5B may be OLEDs. Note that when the red light-emitting element 5R, the green light-emitting element 5G, and the blue light-emitting element 5B are QLEDs, the light-emitting layer included in each of the light-emitting elements with the respective colors is a light-emitting layer including a quantum dot formed by, for example, a coating method or an ink-jet method. When each of the red light-emitting element 5R, the green light-emitting element 5G, and the blue light-emitting element 5B is an OLED, the light-emitting layer included in each of the light-emitting elements with the respective colors is an organic light-emitting layer formed by, for example, vapor deposition.

A control circuit including the transistors TR each of which controls a respective one of the red light-emitting element 5R, the green light-emitting element 5G, and the blue light-emitting element 5B is provided in the thin film transistor layer 4 including the transistors TR corresponding to the red subpixel RSP, the green subpixel GSP, and the blue subpixel BSP. Note that the control circuit including the transistors TR provided corresponding to the red subpixel RSP, the green subpixel GSP, and the blue subpixel BSP and the light-emitting elements are collectively referred to as a subpixel circuit.

The red light-emitting element 5R, the green light-emitting element 5G, and the blue light-emitting element 5B illustrated in FIG. 2 may be a top-emitting type or a bottom emission type. Since each of the red light-emitting element 5R, the green light-emitting element 5G, and the blue light-emitting element 5B has a regular layered structure in which the anode 22, the function layer 24R, 24G, or 24B, and the cathode 25 are formed in this order from the substrate 12 side, the cathode 25 is disposed as an upper layer than the anode 22. In the present embodiment, in order to form the top-emitting type, the anode 22 is formed by using an electrode structure (for example, indium tin oxide (ITO)/Ag/indium tin oxide (ITO)) that can reflect visible light, and the cathode 25 is formed by using an electrode material that can transmit visible light.

In the present embodiment, as described above, the red light-emitting element 5R, the green light-emitting element 5G, and the blue light-emitting element 5B are QLEDs (quantum dot light-emitting diodes), and a quantum dot included in the light-emitting layer of each color includes a ligand made of an organic material. Thus, it is preferable to form the red light-emitting element 5R, the green light-emitting element 5G, and the blue light-emitting element 5B in the regular layered structure by forming the hole injection layer including nickel hydroxide on a side closer to the substrate 12 than the light-emitting layer of each color, that is, by forming the hole injection layer including nickel hydroxide before forming the light-emitting layer of each color so that the ligand including the organic material is not thermally damaged by a heat treatment in the step of forming the hole injection layer including nickel hydroxide, which will be described later. Further, when the red light-emitting element 5R, the green light-emitting element 5G, and the blue light-emitting element 5B are OLEDs (organic light-emitting diodes) and the light-emitting layers of the respective colors are organic light-emitting layers formed by vapor deposition, it is preferable to form the red light-emitting element 5R, the green light-emitting element 5G, and the blue light-emitting element 5B in the regular layered structure by forming the hole injection layer including nickel hydroxide on a side closer to the substrate 12 than the organic light-emitting layer of each color, that is, by forming the hole injection layer including nickel hydroxide before forming the organic light-emitting layer of each color so that the organic light-emitting layers of the respective colors are not thermally damaged by a heat treatment in the step of forming the hole injection layer including nickel hydroxide, which will be described later. On the other hand, when the red light-emitting element 5R, the green light-emitting element 5G, and the blue light-emitting element 5B are QLEDs (quantum dot light-emitting diodes) and the quantum dots included in the light-emitting layers of the respective colors include ligands made of an inorganic material, the red light-emitting element 5R, the green light-emitting element 5G, and the blue light-emitting element 5B may have the regular layered structure or an inverted layered structure in which the cathode 25, the function layer 24R, 24G, or 24B, and the anode 22 are formed in this order from the substrate 12 side. In the inverted layered structure, the light-emitting layer of each color is formed on a side closer to the substrate 12 than the hole injection layer including nickel hydroxide, that is, the light-emitting layer of each color is formed before forming the hole injection layer including nickel hydroxide. In the case of such inverted layered structure, since the anode 22 is disposed as an upper layer than the cathode 25, the cathode 25 is formed by an electrode structure (for example, ITO/Ag/ITO) that can reflect visible light, and the anode 22 is formed by an electrode material that transmits visible light in order to obtain the top-emitting type.

The electrode material that reflects visible light is not particularly limited as long as the material can reflect visible light and has electrical conductivity. Examples include metal materials such as Al, Mg, Li, and Ag, alloys of the metal materials, a layered body of the metal materials and transparent metal oxides (for example, indium tin oxide, indium zinc oxide, indium gallium zinc oxide, and the like), or a layered body of the alloys and the transparent metal oxides.

On the other hand, the electrode material that transmits visible light is not particularly limited as long as the material can transmit visible light and has electrical conductivity. Examples include a thin film formed of a transparent metal oxide (for example, indium tin oxide, indium zinc oxide, indium gallium zinc oxide, and the like) or a metal material such as Al and Ag, or a nano wire formed of a metal material such as Al and Ag.

A typical electrode forming method can be used as the method of forming the anode 22 and the cathode 25, and examples thereof include physical vapor deposition (PVD) such as vacuum vapor deposition, a sputtering method, electron beam (EB) vapor deposition, and an ion plating method, or chemical vapor deposition (CVD). Further, the method of patterning the anode 22 and the cathode 25 is not particularly limited as long as the method is capable of precisely forming a desired pattern, and specific examples include a photolithography method and an ink-jet method.

The sealing layer 6 is a transparent film and, for example, may be formed of an inorganic sealing film 26 covering the cathode 25, an organic film 27 serving as an upper layer overlying the inorganic sealing film 26, and an inorganic sealing film 28 serving as an upper layer overlying the organic film 27. The sealing layer 6 inhibits foreign matters such as water and oxygen from penetrating into the red light-emitting element 5R, the green light-emitting element 5G, and the blue light-emitting element 5B.

The inorganic sealing film 26 and the inorganic sealing film 28 are both inorganic films and may be formed of, for example, a silicon oxide film, a silicon nitride film, a silicon oxynitride film, or a layered film thereof, formed by CVD. The organic film 27 is a transparent organic film having a flattening effect, and may be formed of a coatable organic material such as acrylic, for example. The organic film 27 may be formed by an ink-jet method, for example. The case has been described as an example of the present embodiment in which the sealing layer 6 is formed of two layers of an inorganic film and one layer of an organic film provided between the two layers of the inorganic film. However, the layering order of the two layers of the inorganic film and the one layer of the organic film is not limited thereto. Further, the sealing layer 6 may be formed of only an inorganic film, may be formed of only an organic film, may be formed of one layer of an inorganic film and two layers of an organic film, or may be formed of two or more layers of an inorganic film and two or more layers of an organic film.

The function film 39 is a film with at least one of an optical compensation function, a touch sensor function, or a protection function, for example.

Figure 3:
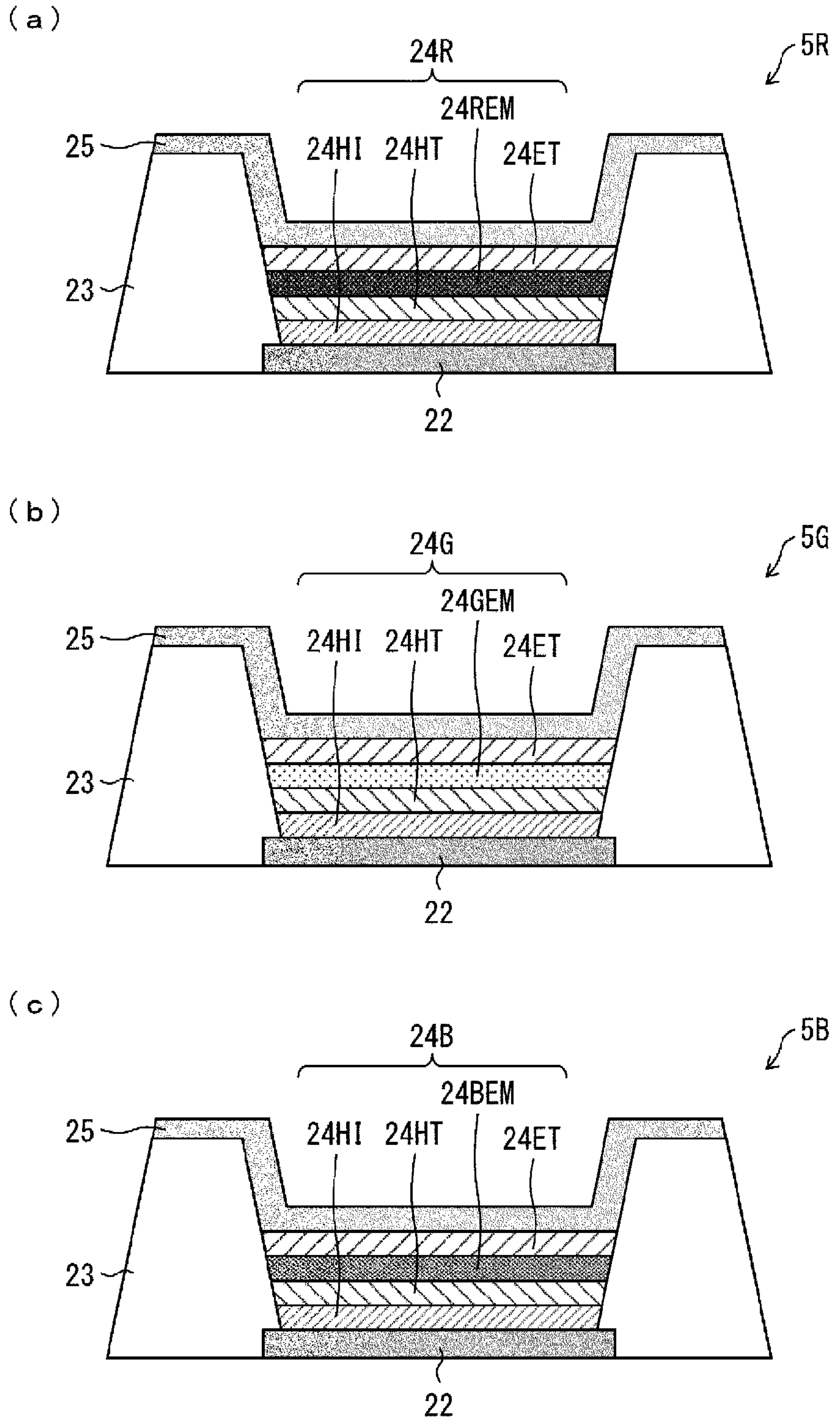
FIG. 3(*a*) is a cross-sectional view illustrating a schematic configuration of a red light-emitting element provided in the display device according to the first embodiment, FIG. 3(*b*) is a cross-sectional view illustrating a schematic configuration of a green light-emitting element provided in the display device according to the first embodiment, and FIG. 3(*c*) is a cross-sectional view illustrating a schematic configuration of a blue light-emitting element provided in the display device according to the first embodiment.

(a) of FIG. 3 is a cross-sectional view illustrating a schematic configuration of the red light-emitting element 5R included in the display device 1, (b) of FIG. 3 is a cross-sectional view illustrating a schematic configuration of the green light-emitting element 5G included in the display device 1, and (c) of FIG. 3 is a cross-sectional view illustrating a schematic configuration of the blue light-emitting element 5B included in the display device 1.

The red light-emitting element 5R illustrated in (a) of FIG. 3 is formed by layering the anode 22, the function layer 24R including a red light-emitting layer 24REM, and the cathode 25 in this order from the substrate 12 (illustrated in FIG. 2) side. In the present embodiment, a case will be described as an example where the function layer 24R including the red light-emitting layer 24REM is formed by layering a hole injection layer 24HI made of nickel hydroxide, a hole transport layer 24HT, the red light-emitting layer 24REM, and an electron transport layer 24ET in this order from the anode 22 side, but no such limitation is intended. Note that when the hole injection layer 24HI is formed of nickel hydroxide, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)] (TFB). In the present embodiment, an example will be described where TFB is used as the hole transport layer 24HT. In addition, as long as the function layer 24R including the red light-emitting layer 24REM includes a layer made of nickel hydroxide between the anode 22 and the red light-emitting layer 24REM, for example, only the hole injection layer 24HI made of nickel hydroxide may be provided between the anode 22 and the red light-emitting layer 24REM, only the hole transport layer made of nickel hydroxide may be provided between the anode 22 and the red light-emitting layer 24REM, a hole injection layer made of a material different from nickel hydroxide and the hole transport layer made of nickel hydroxide may be provided between the anode 22 and the red light-emitting layer 24REM, or a hole injection layer/hole transport layer made of nickel hydroxide and having both functions of a hole injection layer and a hole transport layer may be provided between the anode 22 and the red light-emitting layer 24REM. Further, the function layer 24R including the red light-emitting layer 24REM may include an electron injection layer instead of the electron transport layer 24ET. Furthermore, an electron injection layer may be provided between the electron transport layer 24ET of the function layer 24R including the red light-emitting layer 24REM and the cathode 25.

The green light-emitting element 5G illustrated in (b) of FIG. 3 is formed by layering the anode 22, the function layer 24G including the green light-emitting layer 24GEM, and the cathode 25 in this order from the substrate 12 (illustrated in FIG. 2) side. In the present embodiment, a case will be described as an example in which the function layer 24G including the green light-emitting layer 24GEM is formed by layering the hole injection layer 24HI made of nickel hydroxide, the hole transport layer 24HT, the green light-emitting layer 24GEM, and the electron transport layer 24ET in this order from the anode 22 side. However, no such limitation is intended. Note that when the hole injection layer 24HI is formed of nickel hydroxide, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)] (TFB). In the present embodiment, an example will be described where TFB is used as the hole transport layer 24HT. Additionally, as long as the function layer 24G including the green light-emitting layer 24GEM includes a layer made of nickel hydroxide between the anode 22 and the green light-emitting layer 24GEM, for example, only the hole injection layer 24HI made of nickel hydroxide may be provided between the anode 22 and the green light-emitting layer 24GEM, only the hole transport layer made of nickel hydroxide may be provided between the anode 22 and the green light-emitting layer 24GEM, the hole injection layer made of a material different from nickel hydroxide and the hole transport layer made of nickel hydroxide may be provided between the anode 22 and the green light-emitting layer 24GEM, or a hole injection layer/hole transport layer made of nickel hydroxide and having both functions of a hole injection layer and a hole transport layer may be provided between the anode 22 and the green light-emitting layer 24GEM. In addition, the function layer 24G including the green light-emitting layer 24GEM may include an electron injection layer instead of the electron transport layer 24ET. Further, an electron injection layer may be provided between the electron transport layer 24ET of the function layer 24G including the green light-emitting layer 24GEM and the cathode 25.

The blue light-emitting element 5B illustrated in (c) of FIG. 3 is formed by layering the anode 22, the function layer 24B including the blue light-emitting layer 24BEM, and the cathode 25 in this order from the substrate 12 (illustrated in FIG. 2) side. In the present embodiment, the function layer 24B including the blue light-emitting layer 24BEM is formed by layering the hole injection layer 24HI made of nickel hydroxide, the hole transport layer 24HT, the blue light-emitting layer 24BEM, and the electron transport layer 24ET in this order from the anode 22 side. However, no such limitation is intended. Note that when the hole injection layer 24HI is formed of nickel hydroxide, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)] (TFB). In the present embodiment, an example will be described where TFB is used as the hole transport layer 24HT. Additionally, as long as the function layer 24B including the blue light-emitting layer 24BEM includes a layer made of nickel hydroxide between the anode 22 and the blue light-emitting layer 24BEM, for example, only the hole injection layer 24HI made of nickel hydroxide may be provided between the anode 22 and the blue light-emitting layer 24BEM, only the hole transport layer made of nickel hydroxide may be provided between the anode 22 and the blue light-emitting layer 24BEM, a hole injection layer made of a material different from nickel hydroxide and the hole transport layer made of nickel hydroxide may be provided between the anode 22 and the blue light-emitting layer 24BEM, or a hole injection layer/hole transport layer made of nickel hydroxide and having both functions of a hole injection layer and a hole transport layer may be provided between the anode 22 and the blue light-emitting layer 24BEM. Further, the function layer 24B including the blue light-emitting layer 24BEM may include an electron injection layer instead of the electron transport layer 24ET. Further, an electron injection layer may be provided between the electron transport layer 24ET of the function layer 24B including the blue light-emitting layer 24BEM and the cathode 25.

Figure 4:
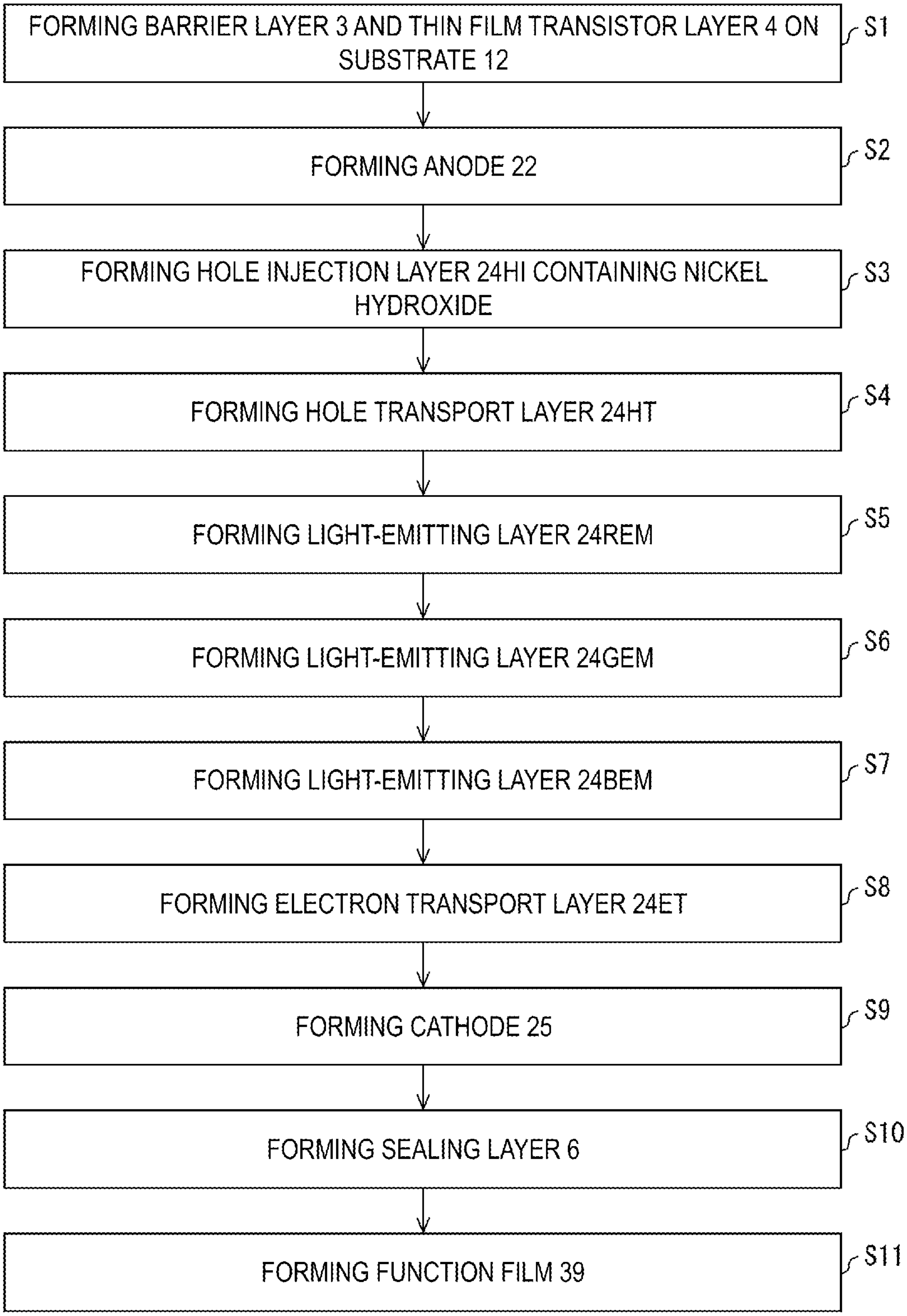
FIG. 4 is a diagram illustrating a process of manufacturing the display device according to the first embodiment.

FIG. 4 is a diagram illustrating a process of manufacturing the display device 1.

As illustrated in FIG. 4, the process of manufacturing the display device 1 includes a step (S1) of forming the barrier layer 3 and the thin film transistor layer 4 on the substrate 12, a step (S2) of forming the anode 22, a step (S3) of forming the hole injection layer 24HI including nickel hydroxide, a step (S4) of forming the hole transport layer 24HT, a step (S5) of forming the red light-emitting layer 24REM, a step (S6) of forming the green light-emitting layer 24GEM, a step (S7) of forming the blue light-emitting layer 24BEM, a step (S8) of forming the electron transport layer 24ET, a step (S9) of forming the cathode 25, a step (S10) of forming the sealing layer 6, and a step (S11) of forming the function film 39. The steps from the step (S2) of forming the anode 22 to the step (S9) of forming the cathode 25 are steps of forming the light-emitting elements 5R, 5G, and 5B on the thin film transistor layer 4. The step of forming the light-emitting elements 5R, 5G, and 5B includes a step of forming a layer including nickel hydroxide between the anode 22 and each of the light-emitting layers 24REM, 24GEM, and 24BEM of the respective colors, like the step (S3) of forming the hole injection layer 24HI including nickel hydroxide.

Although not illustrated, in the present embodiment, a step of forming the edge cover 23 having insulating properties and covering the edge of the anode 22 is included between the step (S2) of forming the anode 22 and the step (S3) of forming the hole injection layer 24HI including nickel hydroxide, but no such limitation is limited.

Additionally, as illustrated in FIG. 4, in the present embodiment, the step (S5) of forming the red light-emitting layer 24REM, the step (S6) of forming the green light-emitting layer 24GEM, and the step (S7) of forming the blue light-emitting layer 24BEM are performed in this order. In the step (S5) of forming the red light-emitting layer 24REM, as illustrated in (a) of FIG. 3, the red light-emitting layer 24REM included in the red light-emitting element 5R is formed in a predetermined shape. In the step (S6) of forming the green light-emitting layer 24GEM, as illustrated in (b) of FIG. 3, the green light-emitting layer 24GEM included in the green light-emitting element 5G is formed in a predetermined shape. In the step (S7) of forming the blue light-emitting layer 24BEM, as illustrated in (c) of FIG. 3, the blue light-emitting layer 24BEM included in the blue light-emitting element 5B is formed in a predetermined shape. Note that the order of performing the step (S5) of forming the red light-emitting layer 24REM, the step (S6) of forming the green light-emitting layer 24GEM, and the step (S7) of forming the blue light-emitting layer 24BEM is not particularly limited.

In the present embodiment, in the step (S3) of forming the hole injection layer 24HI including nickel hydroxide, a case where the hole injection layer 24HI including nickel hydroxide is formed as a common hole injection layer in the red light-emitting element 5R, the green light-emitting element 5G, and the blue light-emitting element 5B is described as an example, as illustrated in (a) of FIG. 3, (b) of FIG. 3, and (c) of FIG. 3, but no such limitation is limited. The hole injection layer 24HI including nickel hydroxide may be formed as a hole injection layer in at least one of the red light-emitting element 5R, the green light-emitting element 5G, and the blue light-emitting element 5B.

In the present embodiment, in the step (S4) of forming the hole transport layer 24HT, as illustrated in (a) of FIG. 3, (b) of FIG. 3, and (c) of FIG. 3, a case where the hole transport layer 24HT is formed as a common hole transport layer in the red light-emitting element 5R, the green light-emitting element 5G, and the blue light-emitting element 5B is described as an example, but no such limitation is limited. The hole transport layer 24HT may be formed as a hole transport layer in at least one of the red light-emitting element 5R, the green light-emitting element 5G, and the blue light-emitting element 5B.

In the present embodiment, in the step (S8) of forming the electron transport layer 24ET, as illustrated in (a) of FIG. 3, (b) of FIG. 3, and (c) of FIG. 3, a case where the electron transport layer 24ET is formed as a common electron transport layer in the red light-emitting element 5R, the green light-emitting element 5G, and the blue light-emitting element 5B is described as an example, but no such limitation is limited. The electron transport layer 24ET may be formed as an electron transport layer in at least one of the red light-emitting element 5R, the green light-emitting element 5G, and the blue light-emitting element 5B.

Figure 5:
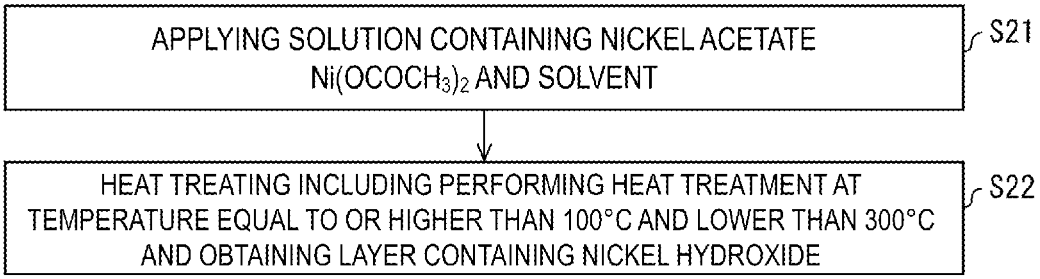
FIG. 5 is a diagram illustrating an example of a step of forming a hole injection layer including nickel hydroxide in the process of manufacturing the display device according to the first embodiment illustrated in FIG. 4.

FIG. 5 is a diagram illustrating an example of a step of forming the hole injection layer 24HI including nickel hydroxide in the process of manufacturing the display device 1 illustrated in FIG. 4.

As illustrated in FIG. 5, the step (S3) of forming the hole injection layer 24HI including nickel hydroxide in the process of manufacturing the display device 1 illustrated in FIG. 4 includes a step (S21) of applying a solution including nickel acetate $Ni(OCOCH_3)_2$ and a solvent, and a heat treatment step (S22) of performing a heat treatment at a temperature equal to or higher than 100° C. and lower than 300° C. after the step of applying the solution, and then, obtaining a layer including nickel hydroxide. For example, ethanol can be used as the solvent. Further, the heat treatment is preferably performed, for example, for a time period equal to or more than one hour and equal to or less than eight hours.

Figure 6:
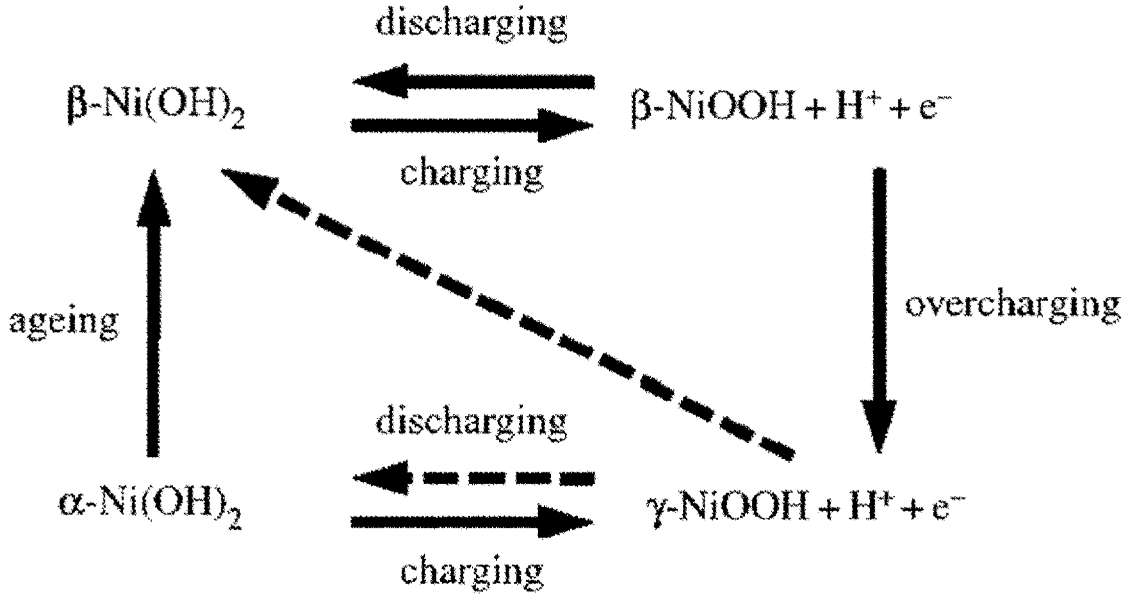
FIG. 6 is a diagram for describing the fact that a layer made of nickel hydroxide has high hole transport capability.

FIG. 6 is a diagram for describing the fact that a layer made of nickel hydroxide has high hole transport capability.

In the layer made of nickel hydroxide obtained by the heat treatment step (S22) illustrated in FIG. 5, both α-nickel hydroxide (α-$Ni(OH)_2$) and β-nickel hydroxide (β-$Ni(OH)_2$) that are illustrated in FIG. 6 are present. Note that since β-nickel hydroxide (β-$Ni(OH)_2$) is more stable than α-nickel hydroxide (α-$Ni(OH)_2$), α-nickel hydroxide (α-$Ni(OH)_2$) tends to change to β-nickel hydroxide (β-Ni $(OH)_2$) over time (due to ageing).

As illustrated in FIG. 6, when electrons e are supplied to α-nickel hydroxide (α-$Ni(OH)_2$) from the hole transport layer 24HT and holes H" are supplied thereto from the anode 22, α-nickel hydroxide is charged and changed to γ-$NiOOH+H^++e^-$. On the other hand, γ-$NiOOH+H^++e^-$ becomes α-nickel hydroxide (α-$Ni(OH)_2$) by supplying holes $H^+$ to the hole transport layer 24HT and supplying electrons e to the anode 22, that is, by discharging. Note that a part of γ-$NiOOH+H^++e^-$ may be discharged to form β-nickel hydroxide (β-$Ni(OH)_2$). Additionally, when electrons $e^-$ are supplied to β-nickel hydroxide (β-$Ni(OH)_2$) from the hole transport layer 24HT and holes $H^+$ are supplied thereto from the anode 22, β-nickel hydroxide is charged and changed to β-$NiOOH+H^++e$. On the other hand, β-$NiOOH+H^++e^-$ becomes β-nickel hydroxide (β-$Ni(OH)_2$) by supplying holes $H^+$ to the hole transport layer 24HT and supplying electrons e to the anode 22, that is, by discharging. Note that β-$NiOOH+H^++e^-$ becomes γ-$NiOOH+H^++e^-$ when overcharged.

The layer made of nickel hydroxide in which both α-nickel hydroxide (α-$Ni(OH)_2$) and β-nickel hydroxide (β-$Ni(OH)_2$) are present transports holes (positive holes) by an oxidation-reduction (redox) reaction, similarly to PEDOT:PSS, which is an organic material. That is, since the layer made of nickel hydroxide transports holes (positive holes) by the same positive hole transport mechanism as that of PEDOT:PSS, which is the organic material, the layer has relatively high positive hole transport capability even though the layer is formed of the inorganic material.

On the other hand, a layer made of a p-type transition metal oxide such as nickel oxide transports holes (positive holes) by movement of carriers. Then, since it is difficult to increase a carrier concentration to a level equal to or more than a certain level, the hole transport capability is reduced compared to the case where holes are transported by the oxidation-reduction (redox) reaction as described above.

Figure 7:
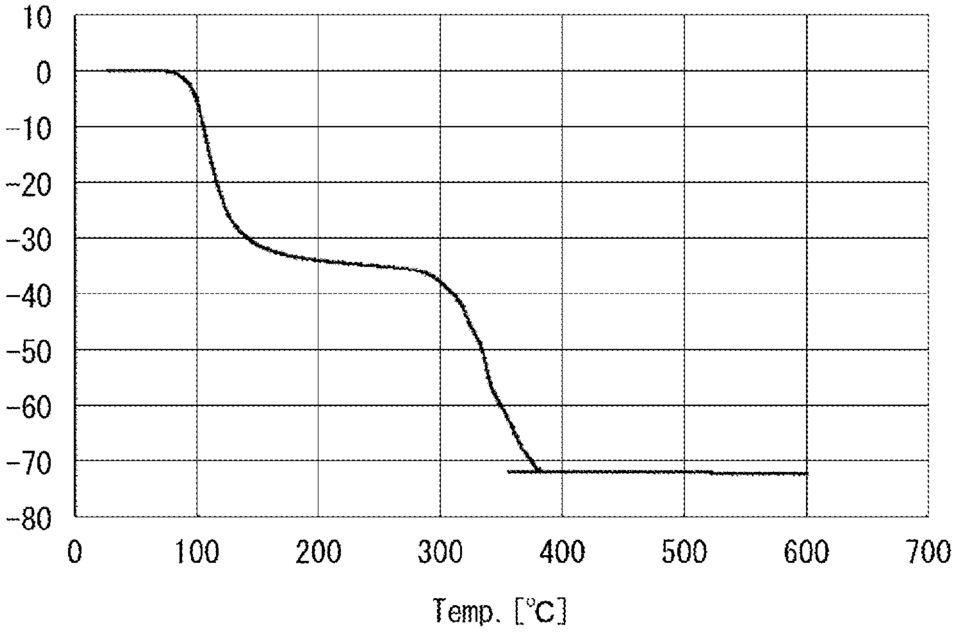
FIG. 7 is a diagram showing a result obtained by differential thermal analysis by thermogravimetry (TG-DTA) of nickel acetate $Ni(OCOCH_3)_2$.

FIG. 7 is a diagram showing a result obtained by differential thermal analysis by thermogravimetry (TG-DTA) of nickel acetate $Ni(OCOCH_3)_2$.

As shown in FIG. 7 and the following Chemical Formula 1, nickel acetate $Ni(OCOCH_3)_2$ has a two-stage reaction in which acetic acid is removed by a heat treatment at a temperature equal to or higher than 100° C. to obtain nickel hydroxide ($Ni(OH)_2$), and dehydration is further performed by a heat treatment at a temperature equal to or higher than 300° C. to obtain nickel oxide (NiO). Note that as shown in FIG. 7, a significant decrease in weight can be confirmed in each of the acetic acid removal process and the dehydration process.

[Chem. 1]

$$Ni(OCOCH_3)_2 4H_2O \rightarrow Ni(OH)_2 \rightarrow NiO \quad \text{(Chemical Formula 1)}$$

Thus, in the case of nickel acetate $Ni(OCOCH_3)_2$, for example, as illustrated in FIG. 5, by setting the heat treatment temperature to a temperature equal to or higher than 100° C. and lower than 300° C., it is possible to control so that only nickel hydroxide ($Ni(OH)_2$) is generated. In the present embodiment, the layer made of nickel hydroxide can be obtained by performing the heat treatment at 230° C. for 1.5 hours, but no such limitation is limited.

As described above, the heat treatment temperature for generating nickel hydroxide ($Ni(OH)_2$) from nickel acetate $Ni(OCOCH_3)_2$ is equal to or higher than 100° C. and lower than 300° C., which is relatively low. Thus, for example, a nickel oxide film can be directly formed on the substrate 12 provided with the thin film transistor layer 4. On the other hand, since a heat treatment temperature for stably generating nickel oxide (NiO) from nickel acetate $Ni(OCOCH_3)$> is equal to or higher than 400° C., which is relatively high. Thus, in consideration of thermal damage to the thin film transistor layer 4, it is difficult to directly form a nickel oxide film on the substrate 12 provided with the thin film transistor layer 4.

Figure 8:
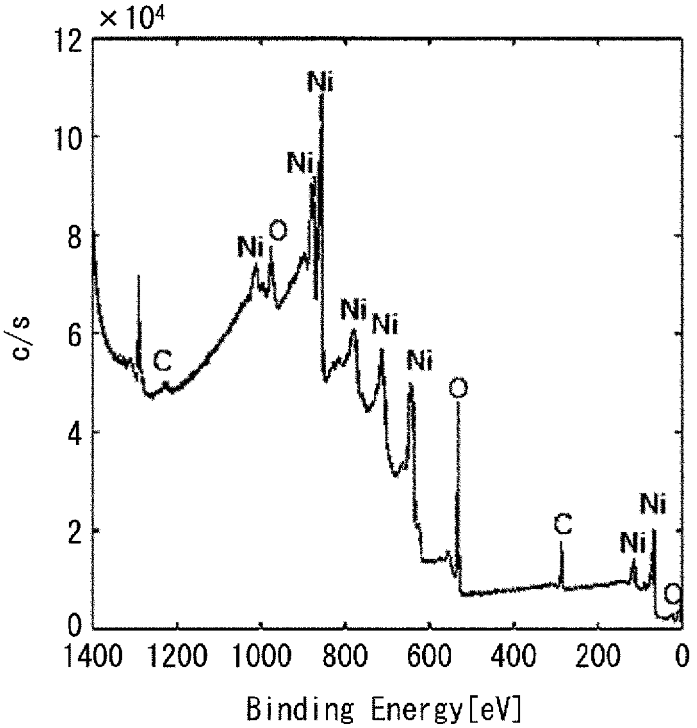
FIG. 8(*a*) is a diagram showing a measurement result obtained by X-ray photoelectron spectroscopy (XPS) of nickel acetate $Ni(OCOCH_3)_2$, and FIG. 8(*b*) is a diagram showing a measurement result obtained by X-ray photoelectron spectroscopy (XPS) of nickel hydroxide obtained by beat-treating nickel acetate $Ni(OCOCH_3)_2$ shown in FIG. 8(*a*).
Figure 8:
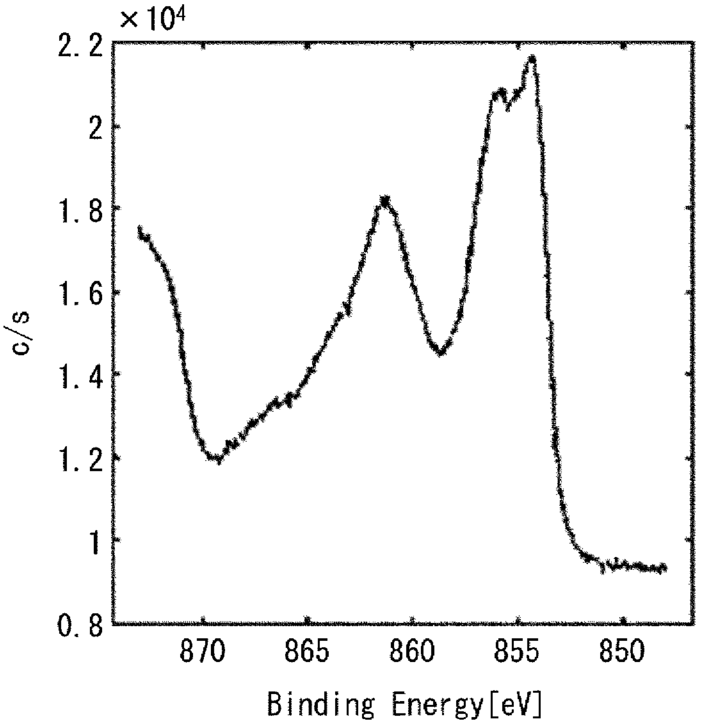

(a) of FIG. 8 is a diagram showing a measurement result obtained by X-ray photoelectron spectroscopy (XPS) of nickel acetate $Ni(OCOCH_3)_2$, and (b) of FIG. 8 is a diagram showing a measurement result obtained by X-ray photoelectron spectroscopy (XPS) of nickel hydroxide obtained by heat-treating nickel acetate $Ni(OCOCH_3)_2$ shown in (a) of FIG. 8.

The result shown in (a) of FIG. 8 can be obtained by measurement, after performing the step (S21) of applying the solution including nickel acetate $Ni(OCOCH_3)_2$ and the solvent as illustrated in FIG. 5 and then performing pre-baking at a temperature of 80° C., which is relatively low, in order to remove the solvent.

The result shown in (b) of FIG. 8 can be obtained by measuring a layer made of nickel hydroxide obtained by further performing the heat treatment at 230° C. for 1.5 hours.

Note that in each of (a) of FIG. 8 and (b) of FIG. 8, the horizontal axis represents binding energies (unit: eV) of photoelectrons, and the vertical axis represents the number of counts per second (unit: c/s) of photoelectrons.

Figure 9:
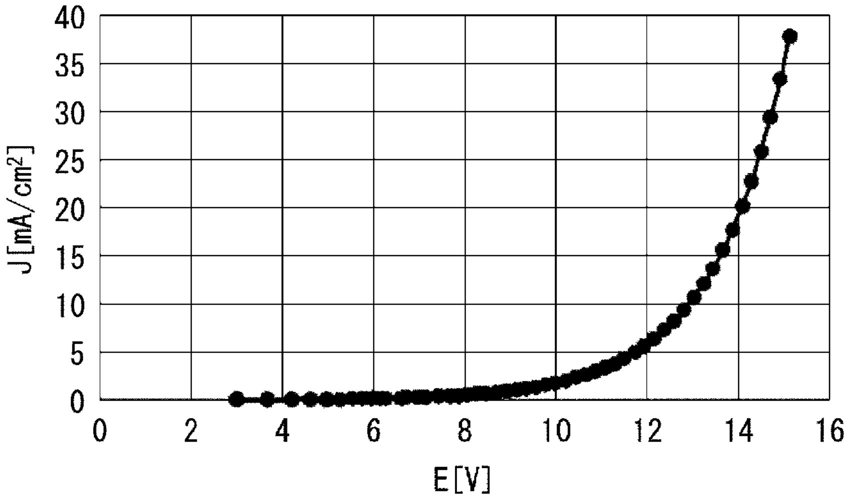
FIG. 9 is a diagram showing a relationship between a voltage and a current density of the light-emitting element provided in the display device according to the first embodiment.

FIG. 9 is a diagram showing a relationship between a voltage V and a current density J of the green light-emitting element 5G provided in the display device 1.

Figure 10:
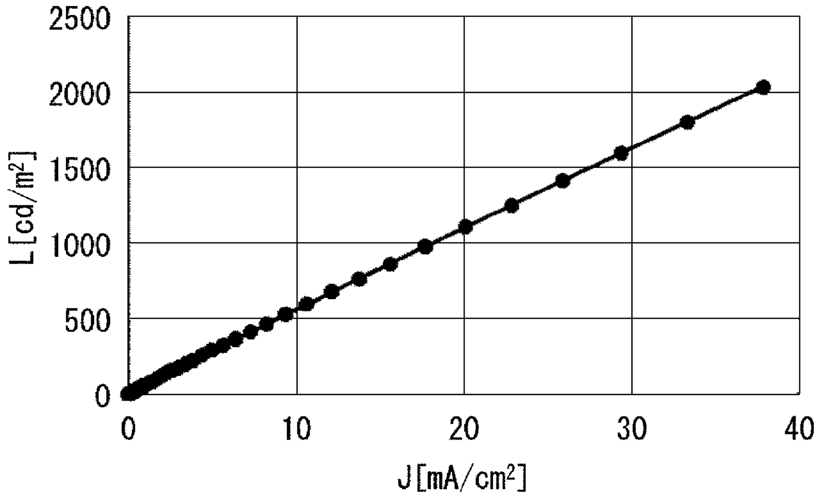
FIG. 10 is a diagram shown a relationship between a current density and a luminance of the light-emitting element provided in the display device according to the first embodiment.

FIG. 10 is a diagram showing a relationship between the current density J and a luminance L of the green light-emitting element 5G provided in the display device 1.

Figure 11:
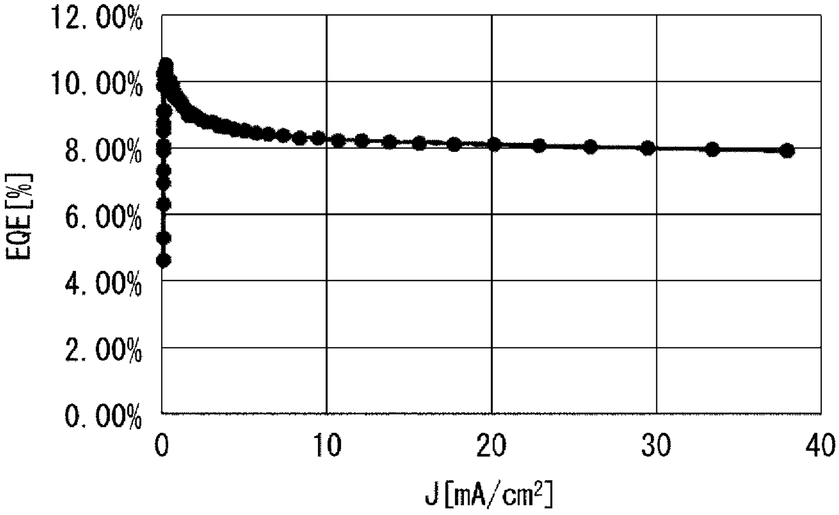
FIG. 11 is a diagram showing a relationship between a current density and an external quantum efficiency of the light-emitting element provided in the display device according to the first embodiment.

FIG. 11 is a diagram showing a relationship between the current density J and an external quantum efficiency EQE of the green light-emitting element 5G provided in the display device 1.

In the green light-emitting element 5G shown in FIG. 9, FIG. 10, and FIG. 11, the hole injection layer 24HI is a layer made of nickel hydroxide ($Ni(OH)_2$), the hole transport layer 24HT is a layer made of TFB, the green light-emitting layer 24GEM is a layer including CdSe/ZnSe, and the electron transport layer 24ET is a layer made of MgZnO.

As shown in FIG. 9, in the relationship between the voltage V and the current density J of the green light-emitting element 5G, the current density J exponentially increases as the voltage increases in a voltage region equal to or higher than 8 V.

As shown in FIG. 10, the relationship between the current density J and the luminance L of the green light-emitting element 5G is such that the luminance L increases approximately in proportion to the current density J.

As shown in FIG. 11, regarding the relationship between the current density J and the external quantum efficiency EQE of the green light-emitting element 5G, the external quantum efficiency EQE equal to or greater than 8% is obtained at the current density J greater than 0. The external quantum efficiency EQE equal to or greater than 8% is substantially at the same level as the value of the external quantum efficiency EQE in the case where the organic hole injection layer PEDOT. PSS is used instead of the hole injection layer 24HI made of nickel hydroxide ($Ni(OH)_2$) in the green light-emitting element 5G.

As illustrated in FIGS. 9, 10, and 11, the green light-emitting element 5G including the hole injection layer 24HI made of nickel hydroxide ($Ni(OH)_2$) exhibits satisfactory and excellent light-emitting element characteristics. Note that although not illustrated, the red light-emitting element 5R and the blue light-emitting element 5B that are provided with the hole injection layer 24HI made of nickel hydroxide ($Ni(OH)_2$) also exhibit satisfactory and excellent light-emitting element characteristics in a similar manner.

Figure 12:
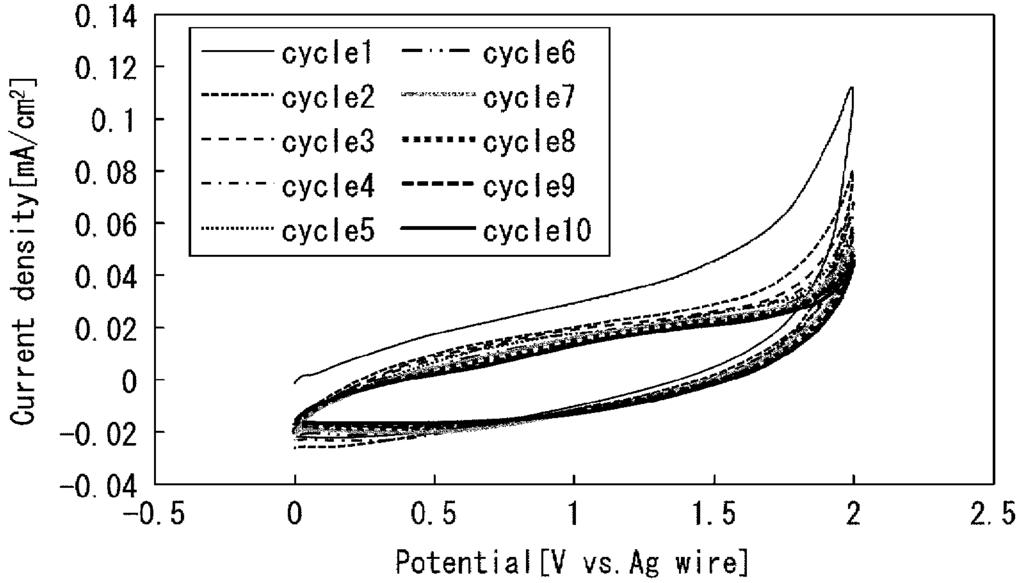
FIG. 12 is a diagram showing measurement results obtained by cyclic voltammetry of a hole injection layer made of PEDOT:PSS.

FIG. 12 is a diagram showing measurement results obtained by cyclic voltammetry of the hole injection layer made of PEDOT:PSS.

Figure 13:
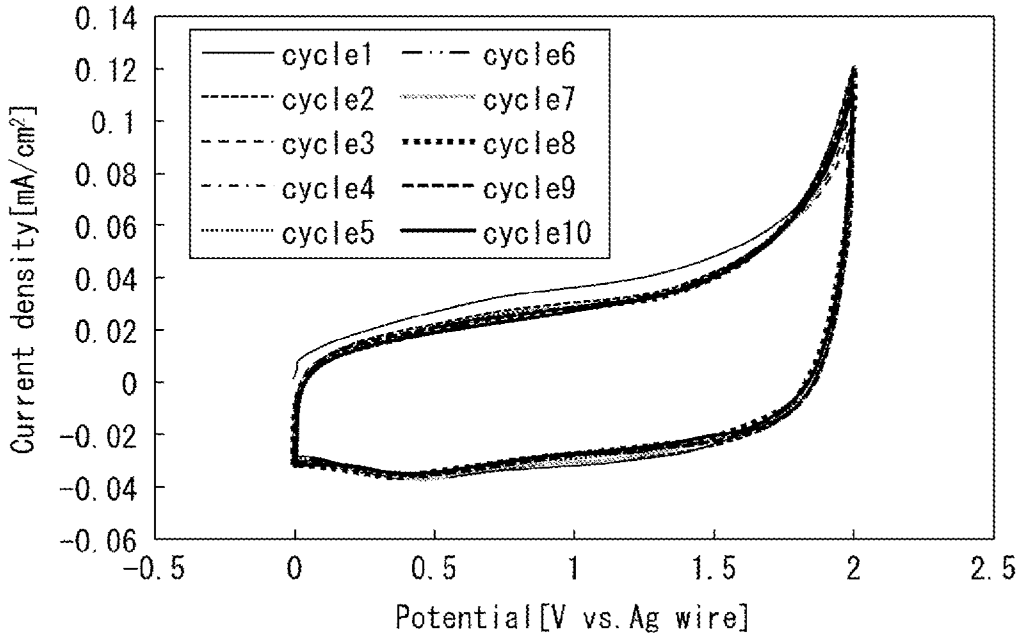
FIG. 13 is a diagram showing measurement results obtained by cyclic voltammetry of a hole injection layer made of nickel hydroxide provided in the display device according to the first embodiment.

FIG. 13 is a diagram showing measurement results obtained by cyclic voltammetry of the hole injection layer 24HI made of nickel hydroxide ($Ni(OH)_2$) provided in the display device 1.

In FIG. 12 and FIG. 13, the horizontal axis represents a potential V (0 to 2 V) with respect to a nano wire of Ag serving as the cathode 25, and the vertical axis represents a current density (unit: $mA/cm^2$).

As shown in FIG. 12, from the measurement results obtained by cyclic voltammetry of the hole injection layer made of PEDOT:PSS, which is the organic material, it is found that the inner area of the cyclic voltammogram decreases as the number of cycles increases. Since the inner area of the cyclic voltammogram means a hole transport capability, the hole transport capability decreases as the number of cycles increases, so that satisfactory reliability cannot be obtained in the case of the hole injection layer made of PEDOT:PSS, which is the organic material.

On the other hand, as shown in FIG. 13, it can be seen from the measurement results obtained by cyclic voltammetry of the hole injection layer 24HI made of nickel hydroxide ($Ni(OH)_2$) that there is no significant change in the inner area of the cyclic voltammogram even when the number of cycles increases. Since the inner area of the cyclic voltammogram means a hole transport capability, the hole transport capability does not decrease even when the number of cycles increases. Thus, in the case of the hole injection layer 24HI made of nickel hydroxide ($Ni(OH)_2$), satisfactory reliability is obtained.

As described above, it is possible to achieve the light-emitting elements 5R, 5G, and 5B that have satisfactory reliability and light-emitting element characteristics and that can be formed without requiring a heat treatment with a high temperature equal to or higher than 400° C., the display device 1 including the light-emitting elements 5R, 5G, and 5B, and the method of manufacturing the display device 1 including the light-emitting elements 5R, 5G, and 5B.

Figure 14:
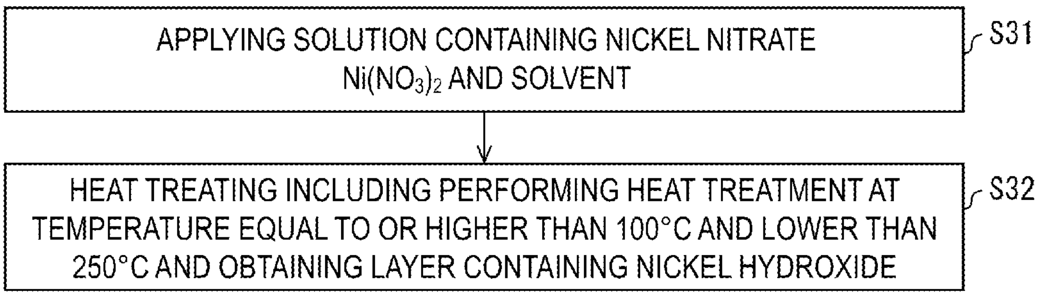
FIG. 14 is a diagram illustrating another example of the step of forming the hole injection layer including nickel hydroxide in the process of manufacturing the display device according to the first embodiment illustrated in FIG. 4.

FIG. 14 is a diagram illustrating another example of the step of forming the hole injection layer 24HI including nickel hydroxide in the process of manufacturing the display device 1 illustrated in FIG. 4.

Figure 15:
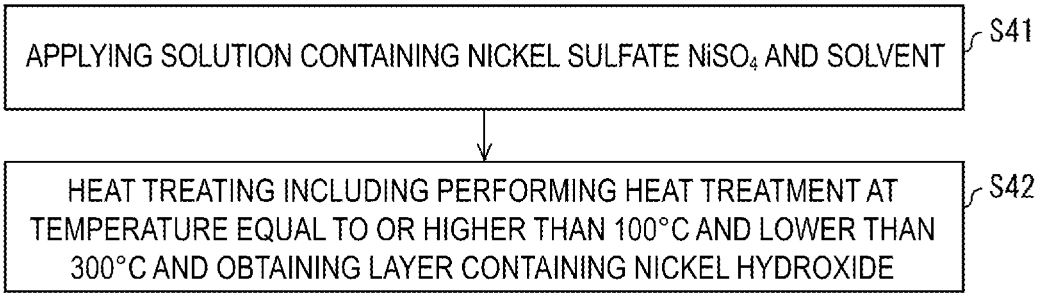
FIG. 15 is a diagram illustrating still another example of the step of forming the hole injection layer including nickel hydroxide in the process of manufacturing the display device according to the first embodiment illustrated in FIG. 4.

FIG. 15 is a diagram illustrating still another example of the step of forming the hole injection layer 24HI including nickel hydroxide in the process of manufacturing the display device 1 illustrated in FIG. 4.

Figure 16:
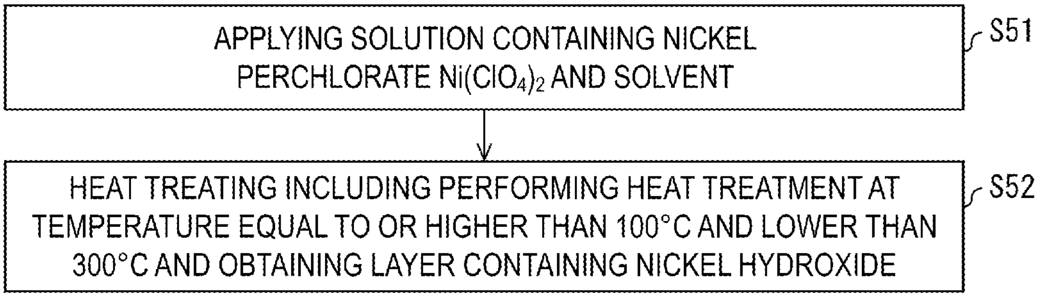
FIG. 16 is a diagram illustrating still another example of the step of forming the hole injection layer including nickel hydroxide in the process of manufacturing the display device according to the first embodiment illustrated in FIG. 4.

FIG. 16 is a diagram illustrating still another example of the step of forming the hole injection layer 24HI including nickel hydroxide in the process of manufacturing the display device 1 illustrated in FIG. 4.

In the present embodiment, as illustrated in FIG. 5, a case has been described as an example of the present embodiment in which nickel acetate $Ni(OCOCH_3)_2$ is heat-treated to form a layer including nickel hydroxide ($Ni(OH)_2$), but no such limitation is limited. For example, as illustrated in FIG. 14, nickel nitrate $Ni(NO_3)_2$ may be heat-treated to form a layer including nickel hydroxide ($Ni(OH)_2$), as illustrated in FIG. 15, nickel sulfate $NiSO_4$ may be heat-treated to form a layer including nickel hydroxide ($Ni(OH)_2$), as illustrated in FIG. 16, nickel perchlorate $Ni(ClO_4)_2$ may be heat-treated to form a layer including nickel hydroxide ($Ni(OH)_2$).

As illustrated in FIG. 14, the step (S3) of forming the hole injection layer 24HI including nickel hydroxide in the process of manufacturing the display device 1 illustrated in FIG. 4 may include a step (S31) of applying a solution including nickel nitrate $Ni(NO_3)_2$ and a solvent, and a heat treatment step (S32) of performing a heat treatment at a temperature equal to or higher than 100° C. and lower than 250° C. to obtain a layer including nickel hydroxide, after the step of applying the solution. For example, ethanol can be used as the solvent. Further, the heat treatment is preferably performed, for example, for a time period equal to or more than one hour and equal to or less than eight hours.

As illustrated in FIG. 15, the step (S3) of forming the hole injection layer 24HI including nickel hydroxide in the process of manufacturing the display device 1 illustrated in FIG. 4 may include a step (S41) of applying a solution including nickel sulfate $NiSO_4$ and a solvent, and a heat treatment step (S42) of performing a heat treatment at a temperature equal to or higher than 100° C. and lower than 300° C. to obtain a layer including nickel hydroxide, after the step of applying the solution. For example, ethanol can be used as the solvent. Further, the heat treatment is preferably performed, for example, for a time period equal to or more than one hour and equal to or less than eight hours.

As illustrated in FIG. 16, the step (S3) of forming the hole injection layer 24HI including nickel hydroxide in the process of manufacturing the display device 1 illustrated in FIG. 4 may include a step (S51) of applying a solution including nickel perchlorate $Ni(ClO_4)_2$ and a solvent, and a heat treatment step (S52) of performing a heat treatment at a temperature equal to or higher than 100° C. and lower than 300° C. to obtain a layer including nickel hydroxide, after the step of applying the solution. For example, ethanol can be used as the solvent. Further, the heat treatment is preferably performed, for example, for a time period equal to or more than one hour and equal to or less than eight hours.

Note that although not illustrated, the step (S3) of forming the hole injection layer 24HI including nickel hydroxide in the process of manufacturing the display device 1 illustrated in FIG. 4 may include a step of applying a solution including at least one of nickel acetate $Ni(OCOCH_3)_2$, nickel nitrate $Ni(NO_3)_2$, nickel sulfate $NiSO_4$, and nickel perchlorate $Ni(ClO_4)_2$ and a solvent, and a heat treatment step of performing a heat treatment to obtain a layer including nickel hydroxide, after the step of applying the solution. For example, ethanol can be used as the solvent. Further, the heat treatment is preferably performed, for example, for a time period equal to or more than one hour and equal to or less than eight hours.

Second Embodiment

Next, a second embodiment of the disclosure will be described with reference to FIG. 17 and FIG. 18. Light-emitting elements provided in a display device 1A according to the present embodiment are different from those of the first embodiment described above in that the light-emitting elements in the display device 1A include hole injection layers 24HI' to 24HI''' that are made of nickel hydroxide and that are layered bodies of a plurality of thin film layers 24HI1 to 24HIn made of nickel hydroxide. The others are as described in the first embodiment. For convenience of description, members having the same functions as those illustrated in diagrams of the first embodiment are denoted by the same reference signs, and descriptions thereof are omitted.

When a film thickness of the applied film is relatively great in the step (S21) of applying the solution including nickel acetate $Ni(OCOCH_3)_2$ and the solvent as illustrated in FIG. 5 of the first embodiment and when a film thickness of the film obtained after the heat treatment step (S22) of performing the heat treatment at the temperature equal to or higher than 100° C. and lower than 300° C. to obtain the layer including nickel hydroxide as illustrated in FIG. 5 of the first embodiment is also relatively great, a removal amount of acetic acid is great in the heat treatment step (S22) due to the great film thickness, and cracks or the like easily occur in the formed film. On the other hand, when a film thickness of the applied film is relatively less in the step (S21) of applying the solution including nickel acetate $Ni(OCOCH_3)_2$ and the solvent as illustrated in FIG. 5 of the first embodiment, and when a film thickness of the film obtained after the heat treatment step (S22) of performing the heat treatment at the temperature equal to or higher than 100° C. and lower than 300° C. to obtain the layer including nickel hydroxide as illustrated in FIG. 5 of the first embodiment is also relatively less, the removal amount of acetic acid is less in the heat treatment step (S22) because of the less film thickness, so that cracks or the like are less likely to occur in the formed film.

For this reason, in the step (S3) of forming the hole injection layer including nickel hydroxide in the process of manufacturing the display device illustrated in FIG. 4, the step (S21) of applying the solution illustrated in FIG. 5 and the heat treatment step (S21) after the step (S22) of applying the solution illustrated in FIG. 5 are preferably performed a plurality of times to form the hole injection layer including nickel hydroxide as a layered body of a plurality of layers. Further, it is more preferable that a film thickness of each of the plurality of layers constituting the layered body (film thickness after the heat treatment step) be equal to or less than 50 nm. Such a method in which the step (S21) of applying the solution illustrated in FIG. 5 and the heat treatment step (S22) after the step (S21) of applying the solution illustrated in FIG. 5 are performed a plurality of times to form a film is also referred to as a recoating method.

Figure 17:
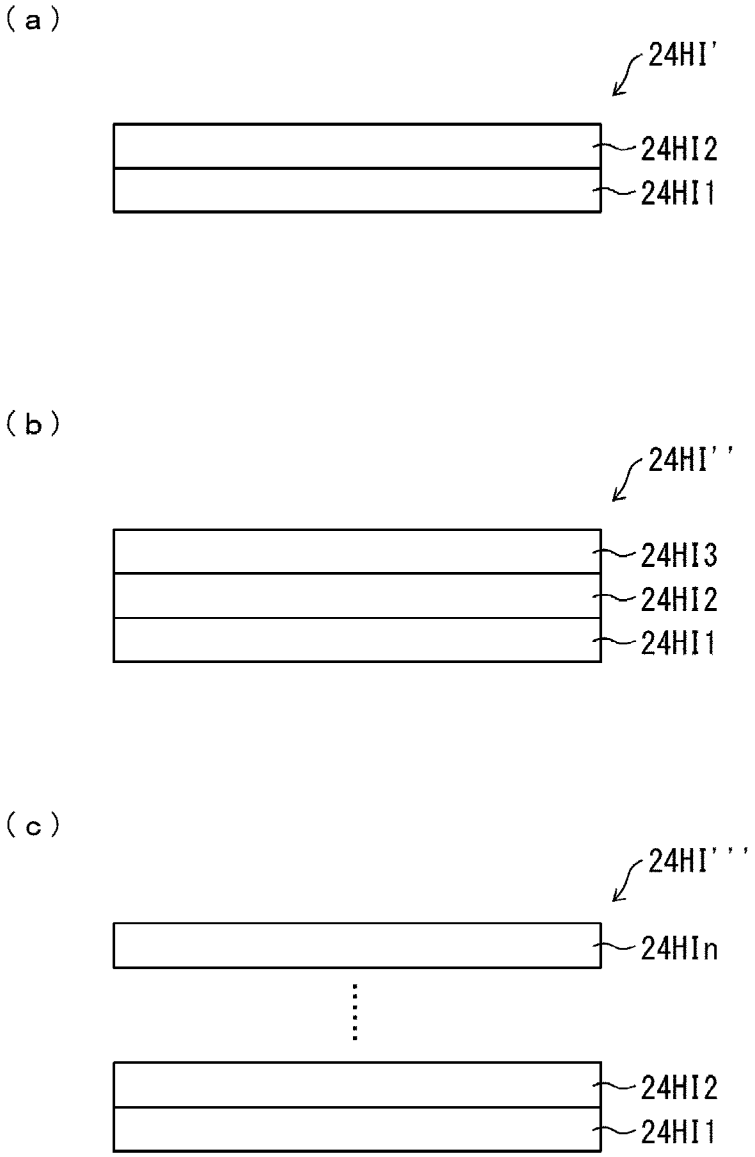
FIGS. 17(*a*), (*b*), and (*c*) are diagrams illustrating an example of a hole injection layer that is a layered body of a plurality of layers made of nickel hydroxide included in a light-emitting element of a display device according to a second embodiment.

(a) of FIG. 17, (b) of FIG. 17, and (c) of FIG. 17 are diagrams illustrating an example of the hole injection layers 24HI' to 24HI'' that constitute a layered body of the plurality of thin film layers 24HI1 to 24HIn made of nickel hydroxide included in the light-emitting elements of the display device 1A according to the second embodiment.

The hole injection layer 24HI' made of nickel hydroxide illustrated in (a) of FIG. 17 is a layered body of the thin film layer 24HI1 made of nickel hydroxide and the thin film layer 24HI2 made of nickel hydroxide. That is, the hole injection layer 24HI' made of nickel hydroxide is a layered body of two layers made of nickel hydroxide. In the present embodiment, each of the thin film layer 24HI1 made of nickel hydroxide and the thin film layer 24HI2 made of nickel hydroxide is formed to have a thickness equal to or less than 50 nm, but no such limitation is limited. From the viewpoint of reducing the number of steps, the film thickness of the thin film layer made of nickel hydroxide is preferably equal to or more than a certain thickness. Thus, each of the thin film layer 24HI1 made of nickel hydroxide and the thin film layer 24HI2 made of nickel hydroxide is preferably formed to have a film thickness equal to or more than 10 nm and equal to or less than 50 nm, and is more preferably formed to have a film thickness equal to or more than 15 nm and equal to or less than 50 nm. The thin film layer 24HI1 made of nickel hydroxide and the thin film layer 24HI2 made of nickel hydroxide may have the same thickness or different thicknesses. For example, when each of the thin film layer 24HI1 made of nickel hydroxide and the thin film layer 24HI2 made of nickel hydroxide is applied at the same number of revolutions (same rpm) by using a spin coater to form the thin film layer 24HI1 including nickel hydroxide and having a film thickness greater than a film thickness of the thin film layer 24HI2 including nickel hydroxide, nickel acetate $Ni(OCOCH_3)_2$ in the solution for forming the thin film layer 24HI1 including nickel hydroxide may be adjusted to have a higher concentration (for example, 200 mM), and nickel acetate $Ni(OCOCH_3)_2$ in the solution for forming the thin film layer 24HI2 including nickel hydroxide may be adjusted to have a lower concentration (for example, 80 mM). Note that instead of the spin coater, for example, a slit coater or the like may be used to apply each of the thin film layer 24HI1 made of nickel hydroxide and the thin film layer 24HI2 made of nickel hydroxide.

The hole injection layer 24HI" made of nickel hydroxide illustrated in (b) of FIG. 17 is a layered body of the thin film layer 24HI1 made of nickel hydroxide, the thin film layer 24HI2 made of nickel hydroxide, and the thin film layer 24HI3 made of nickel hydroxide. That is, the hole injection layer 24HI" made of nickel hydroxide is a layered body of three thin film layers made of nickel hydroxide. In the present embodiment, each of the thin film layer 24HI1 made of nickel hydroxide, the thin film layer 24HI2 made of nickel hydroxide, and the thin film layer 24HI3 made of nickel hydroxide is formed to have a thickness equal to or less than 50 nm, but no such limitation is limited. From the viewpoint of reducing the number of steps, the film thickness of the thin film layer made of nickel hydroxide is preferably equal to or more than a certain value, and thus, each of the thin film layer 24HI1 made of nickel hydroxide, the thin film layer 24HI2 made of nickel hydroxide, and the thin film layer 24HI3 made of nickel hydroxide is preferably formed to have a film thickness, for example, equal to or more than 10 nm and equal to or less than 50 nm, and is more preferably formed to have a film thickness equal to or more than 15 nm and equal to or less than 50 nm. The thin film layer 24HI1 made of nickel hydroxide, the thin film layer 24HI2 made of nickel hydroxide, and the thin film layer 24HI3 made of nickel hydroxide may have the same thickness or different thicknesses.

The hole injection layer 24HI" made of nickel hydroxide illustrated in (c) of FIG. 17 is a layered body of n (n is a natural number equal to or more than 4) thin film layers 24HI1 to 24HIn made of nickel hydroxide. In the present embodiment, each of the n thin film layers 24HI1 to 24HIn made of nickel hydroxide is formed to have a film thickness equal to or less than 50 nm, but no such limitation is limited. From the viewpoint of reducing the number of steps, the film thickness of the thin film layer made of nickel hydroxide is preferably equal to or greater than a certain value, and thus, each of the n thin film layers 24HI1 to 24HIn made of nickel hydroxide is preferably formed to have a film thickness equal to or greater than 10 nm and equal to or less than 50 nm, and is more preferably formed to have a film thickness equal to or greater than 15 nm and equal to or less than 50 nm, for example. The n thin film layers 24HI1 to 24HIn made of nickel hydroxide may have the same thickness or different thicknesses.

Figure 18:
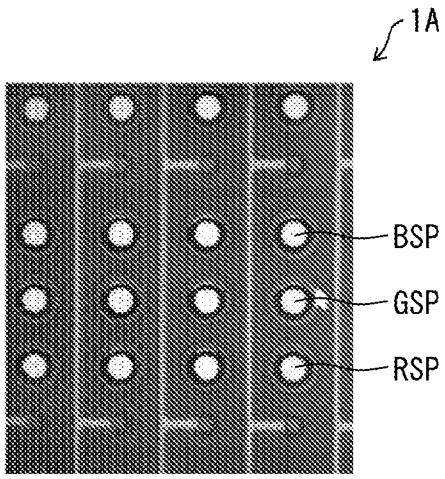
FIG. 18 is a diagram illustrating a case where layers up to the hole injection layer that is the layered body of the plurality of layers made of nickel hydroxide are formed in the process of manufacturing the display device according to the second embodiment.

FIG. 18 is a diagram illustrating a case where layers up to the hole injection layer 24HI" that is a layered body of three thin film layers 24HI1 to 24HI3 made of nickel hydroxide illustrated in (b) of FIG. 17 are formed in the process of manufacturing the display device 1A.

As illustrated in FIG. 18, no cracking or the like occurs in the hole injection layer 24HI" included in each of the light-emitting elements included in the red subpixel RSP, the green subpixel GSP, and the blue subpixel BSP of the display device 1A.

The above-described hole injection layers 24HI' to 24HI" made of nickel hydroxide are less likely to be cracked even when the film thicknesses thereof are relatively great. Thus, it is possible to improve the reliability of the light-emitting elements including the hole injection layers 24HI' to 24HI'" and the display device 1A including the light-emitting elements.

In the present embodiment, the case where the layered body of the plurality of thin film layers 24HI1 to 24HIn made of nickel hydroxide is formed as the hole injection layers 24HI' to 24HI" made of nickel hydroxide has been described as an example, but no such limitation is limited. For example, the layered body of the plurality of thin film layers 24HI1 to 24HIn made of nickel hydroxide may be formed as a hole transport layer made of nickel hydroxide or a hole injection layer/hole transport layer made of nickel hydroxide.

Note that in the present embodiment, the case where the thin film layers 24HI1 to 24HIn made of nickel hydroxide are formed from nickel acetate $Ni(OCOCH_3)_2$ has been described as an example, but no such limitation is limited. For example, from any one of nickel nitrate $Ni(NO_3)_2$, nickel sulfate $NiSO_4$, and nickel perchlorate $Ni(ClO_4)_2$, the thin film layers 24HI1 to 24HIn including nickel hydroxide may be formed.

Third Embodiment

Next, with reference to FIG. 19 and FIG. 20, a third embodiment of the disclosure will be described. A method of manufacturing a display device 1B of the present embodiment is different from those of the above-described first and second embodiments in that the method of the present embodiment includes a first heat treatment step that is a heat treatment step at a relatively low temperature and a second heat treatment step that is a heat treatment step at a relatively high temperature. The others are as described in the first and second embodiments. For convenience of description, members having the same functions as the members illustrated in the diagrams in the first and second embodiments are denoted by the same reference signs, and descriptions thereof will be omitted.

Figure 19:
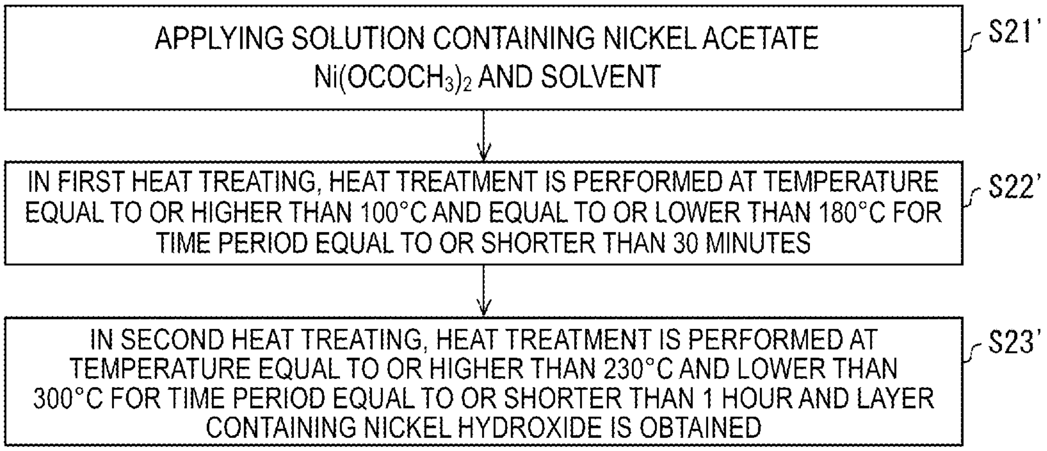
FIG. 19 is a diagram illustrating an example of a step of forming a hole injection layer including nickel hydroxide in a process of manufacturing a display device according to a third embodiment.

FIG. 19 is a diagram illustrating an example of a step of forming a hole injection layer made of nickel hydroxide in the process of manufacturing the display device 1B.

As illustrated in FIG. 19, the step of forming the hole injection layer made of nickel hydroxide includes a step (S21') of applying a solution including nickel acetate $Ni(OCOCH_3)_2$ and a solvent, a first heat treatment step (S22') that is performed at a heat treatment temperature equal to or higher than 100° C. and equal to or lower than 180° C., and a second heat treatment step (S23') that is performed at a heat treatment temperature equal to or higher than 230° C. and lower than 300° C.

Note that although a heat treatment is performed for 30 minutes in the first heat treatment step (S22') and a heat treatment is performed for 1 hour in the second heat treatment step (S23') in the present embodiment, no such limitation is limited, and it is preferable that the heat treatment be performed for a time period equal to or more than 5 minutes and equal to or less than 30 minutes in the first heat treatment step (S22') and the heat treatment be performed for a time period equal to or more than 15 minutes and equal to or less than 1 hour in the second heat treatment step (S23').

As described above, in the case where the heat treatment step is a two-stage process including the first heat treatment step (S22') that is a heat treatment step at a relatively low temperature and the second heat treatment step (S23') that is a heat treatment step at a relatively high temperature, cracks or the like are less likely to occur in the formed film as compared with a one-stage process including only a heat treatment step at a relatively high temperature.

Figure 20:
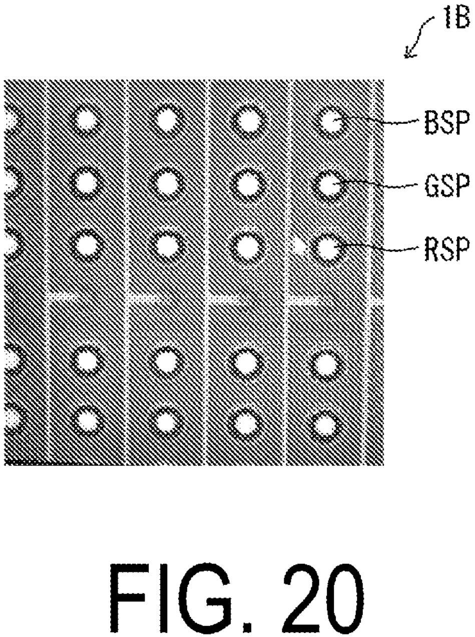
FIG. 20 is a diagram illustrating a case where layers up to the hole injection layer including nickel hydroxide are formed in the process of manufacturing the display device according to the third embodiment.

FIG. 20 is a diagram illustrating a case where layers up to a hole injection layer made of nickel hydroxide are formed in the process of manufacturing the display device 1B.

As illustrated in FIG. 20, the hole injection layers included in the light-emitting elements included in each of the red subpixel RSP, the green subpixel GSP, and the blue subpixel BSP of the display device 1B are formed by the above-described two-stage heat treatment process, and cracks or the like do not occur.

As described above, since the hole injection layer made of nickel hydroxide formed by the two-stage heat treatment process is less likely to be cracked, it is possible to improve the reliability of the light-emitting elements including the hole injection layers made of nickel hydroxide that are formed by the two-stage heat treatment process and the display device 1B including the light-emitting elements.

In the present embodiment, although the case of forming the hole injection layer including nickel hydroxide from nickel acetate $Ni(OCOCH_3)_2$ has been described as an example, no such limitation is limited. For example, from any one of nickel nitrate $Ni(NO_3)_2$, nickel sulfate $NiSO_4$, and nickel perchlorate $Ni(ClO_4)_2$, the hole injection layer including nickel hydroxide may be formed.

When the hole injection layer including nickel hydroxide is formed from a film formed by applying a solution including nickel nitrate $Ni(NO_3)_2$ and a solvent, the first heat treatment step (S22') is preferably performed at a heat treatment temperature equal to or higher than 100° C. and equal to or lower than 180° C., and the second heat treatment step (S23') is preferably performed at a heat treatment temperature equal to or higher than 230° C. and lower than 250° C. Note that in the first heat treatment step (S22'), the heat treatment is preferably performed for a time period equal to or more than 5 minutes and equal to or less than 30 minutes, and in the second heat treatment step (S23'), the heat treatment is preferably performed for a time period equal to or more than 15 minutes and equal to or less than 1 hour.

When the hole injection layer including nickel hydroxide is formed from a film formed by applying a solution including nickel sulfate $NiSO_4$ or nickel perchlorate $Ni(ClO_4)_2$ and a solvent, the first heat treatment step (S22') is preferably performed at a heat treatment temperature equal to or higher than 100° C. and equal to or lower than 180° C., and the second heat treatment step (S23') is preferably performed at a heat treatment temperature equal to or higher than 230° C. and lower than 300° C. Note that in the first heat treatment step (S22'), the heat treatment is preferably performed for a time period equal to or more than 5 minutes and equal to or less than 30 minutes, and in the second heat treatment step (S23'), the heat treatment is preferably performed for a time period equal to or more than 15 minutes and equal to or less than 1 hour.

In the present embodiment, the case where the layer made of nickel hydroxide and formed by the above-described two-stage heat treatment process is formed as the hole injection layer has been described as an example, but no such limitation is limited. For example, the layer made of nickel hydroxide and formed by the above-described two-stage heat treatment process may be formed as a hole transport layer including nickel hydroxide or a hole injection layer/hole transport layer including nickel hydroxide.

It is to be noted that the method of forming the hole injection layer including nickel hydroxide described in the second embodiment by using a layered body of a plurality of layers made of nickel hydroxide, and the method of performing the heat treatment step in two stages as described in the present embodiment may be combined.

Supplement

First Aspect

A light-emitting element including
- an anode,
- a cathode,
- a light-emitting layer provided between the anode and the cathode, and
- a layer made of nickel hydroxide, the layer being provided between the anode and the light-emitting layer.

Second Aspect

The light-emitting element according to the first aspect,
- wherein the layer made of nickel hydroxide is a layered body of a plurality of thin film layers made of nickel hydroxide, each of the plurality of thin film layers having a film thickness equal to or less than 50 nm.

Third Aspect

The light-emitting element according to the first or second aspect,
- wherein the layer made of nickel hydroxide is a hole injection layer, and
- a hole transport layer is further provided between the hole injection layer and the light-emitting layer.

Fourth Aspect

A display device including
- a substrate,
- a thin film transistor layer provided on the substrate, and
- a plurality of the light-emitting elements according to any one of the first to third aspects are provided on the thin film transistor layer,
- wherein the plurality of the light-emitting elements include a first light-emitting element, a second light-emitting element, and a third light-emitting element,
- the first light-emitting element includes a first light-emitting layer as the light-emitting layer,
- the second light-emitting element includes, as the light-emitting layer, a second light-emitting layer having a light-emission peak wavelength different from a light-emission peak wavelength of the first light-emitting layer, and
- the third light-emitting element includes, as the light-emitting layer, a third light-emitting layer having a light-emission peak wavelength different from the light-emission peak wavelengths of the first light-emitting layer and the second light-emitting layer.

Fifth Aspect

The display device according to the fourth aspect,
- wherein each of the first light-emitting layer, the second light-emitting layer, and the third light-emitting layer is the light-emitting layer including a quantum dot, and
- in each of the first light-emitting element, the second light-emitting element, and the third light-emitting element, the anode is provided closer to the substrate than the cathode, and the layer made of nickel hydroxide is provided closer to the substrate than the light-emitting layer.

Sixth Aspect

A method of manufacturing a display device, including forming a thin film transistor layer on a substrate, and forming a light-emitting element on the thin film transistor layer, the light-emitting element including an anode, a cathode, and a light-emitting layer provided between the anode and the cathode, wherein the forming a light-emitting element further includes forming a layer including nickel hydroxide between the anode and the light-emitting layer.

Seventh Aspect

The method of manufacturing the display device according to the sixth aspect, wherein the layer including nickel hydroxide is a hole injection layer, and the forming a light-emitting element further includes forming a hole transport layer between the hole injection layer and the light-emitting layer.

Eighth Aspect

The method of manufacturing the display device according to the sixth or seventh aspect, wherein the forming a layer including nickel hydroxide includes applying a solution including at least one of nickel acetate $Ni(OCOCH_3)_2$, nickel nitrate $Ni(NO_3)_2$, nickel sulfate $NiSO_4$, and nickel perchlorate $Ni(ClO_4)_2$ and a solvent, and heat treating including performing a heat treatment after the applying a solution and then obtaining the layer including nickel hydroxide.

Ninth Aspect

The method of manufacturing the display device according to the sixth or seventh aspect, wherein the forming a layer including nickel hydroxide includes applying a solution including nickel acetate $Ni(OCOCH_3)_2$ and a solvent, and heat treating including performing a heat treatment at a temperature equal to or higher than 100° C. and lower than 300° C. after the applying a solution and then obtaining the layer including nickel hydroxide.

Tenth Aspect

The method of manufacturing the display device according to the sixth or seventh aspect, wherein the forming a layer including nickel hydroxide includes applying a solution including nickel sulfate $NiSO_4$ and a solvent, and heat treating including performing a heat treatment at a temperature equal to or higher than 100° C. and lower than 300° C. after the applying a solution and then obtaining the layer including nickel hydroxide.

Eleventh Aspect

The method of manufacturing the display device according to the sixth or seventh aspect, wherein the forming a layer including nickel hydroxide includes applying a solution including nickel perchlorate $Ni(ClO_4)_2$ and a solvent, and heat treating including performing a heat treatment at a temperature equal to or higher than 100° C. and lower than 300° C. after the applying a solution and then obtaining the layer including nickel hydroxide.

Twelfth Aspect

The method of manufacturing the display device according to the sixth or seventh aspect, wherein the forming a layer including nickel hydroxide includes applying a solution including nickel nitrate $Ni(NO_3)_2$ and a solvent, and heat treating including performing a heat treatment at a temperature equal to or higher than 100° C. and lower than 250° C. after the applying a solution and then obtaining the layer including nickel hydroxide.

Thirteenth Aspect

The method of manufacturing the display device according to any one of the ninth to eleventh aspects, wherein the heat treating after the applying a solution includes first heat treating and second heat treating that is performed after the first heat treating, the first heat treating is performed at a heat treatment temperature equal to or higher than 100° C. and equal to or lower than 180° C., and the second heat treating is performed at a heat treatment temperature equal to or higher than 230° C. and lower than 300° C.

Fourteenth Aspect

The method of manufacturing the display device according to the twelfth aspect, wherein the heat treating after the applying a solution includes first heat treating and second heat treating that is performed after the first heat treating, the first heat treating is performed at a heat treatment temperature equal to or higher than 100° C. and equal to or lower than 180° C., and the second heat treating is performed at a heat treatment temperature equal to or higher than 230° C. and lower than 250° C.

Fifteenth Aspect

The method of manufacturing the display device according to the thirteenth or fourteenth aspect, wherein in the first heat treating, a heat treatment is performed for a time period equal to or more than 5 minutes and equal to or less than 30 minutes, and in the second heat treating, a heat treatment is performed for a time period equal to or more than 15 minutes and equal to or less than 1 hour.

Sixteenth Aspect

The method of manufacturing the display device according to any one of the eighth to fifteenth aspects, wherein in the forming a layer including nickel hydroxide, the applying a solution and the heat treating after the applying a solution are performed a plurality of times, and then, the layer including nickel hydroxide is formed as a layered body of a plurality of layers.

Seventeenth Aspect

The method of manufacturing the display device according to the sixteenth aspect, wherein each of the plurality of layers constituting the layered body is a thin film layer made of nickel hydroxide, the thin film layer having a film thickness equal to or less than 50 nm.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a light-emitting element, a display device, and a method of manufacturing the display device.

The invention claimed is:

1. A light-emitting element comprising:

an anode;

a cathode;

a light-emitting layer provided between the anode and the cathode; and a layer made of nickel hydroxide provided between the anode and the light-emitting layer, wherein the layer made of nickel hydroxide is a layered body comprising a plurality of thin film layers made of nickel hydroxide, each of the plurality of thin film layers having a film thickness equal to or less than 50 nm.

2. The light-emitting element according to claim 1, wherein the layer made of nickel hydroxide is a hole injection layer, and a hole transport layer is further provided between the hole injection layer and the light-emitting layer.

3. A display device comprising:

a substrate;

a thin film transistor layer provided on the substrate; and a plurality of light-emitting elements, including the light-emitting element according to claim 1, provided on the thin film transistor layer, wherein:

the plurality of light-emitting elements further includes a first light-emitting element, a second light-emitting element, and a third light-emitting element, the first light-emitting element includes a first light-emitting layer as the light-emitting layer, the second light-emitting element includes, as the light-emitting layer, a second light-emitting layer having a second light-emission peak wavelength different from a first light-emission peak wavelength of the first light-emitting layer, and the third light-emitting element includes, as the light-emitting layer, a third light-emitting layer having a third light-emission peak wavelength different from the first and second light-emission peak wavelengths.

4. The display device according to claim 3, wherein each of the first light-emitting layer, the second light-emitting layer, and the third light-emitting layer includes a quantum dot, and in each of the first light-emitting element, the second light-emitting element, and the third light-emitting element, the anode is provided closer to the substrate than to the cathode, and the layer made of nickel hydroxide is provided closer to the substrate than to the light-emitting layer.

5. A method of manufacturing a display device, the method comprising:

forming a thin film transistor layer on a substrate; and forming a light-emitting element on the thin film transistor layer, the light-emitting element including an anode, a cathode, and a light-emitting layer provided between the anode and the cathode, wherein:

forming of the light-emitting element includes forming a layer including nickel hydroxide between the anode and the light-emitting layer, and forming of the layer including nickel hydroxide includes:

applying a solution including at least one of nickel acetate $Ni(OCOCH_3)_2$, nickel nitrate $Ni(NO_3)_2$, nickel sulfate $NiSO_4$, and nickel perchlorate $Ni(ClO_4)_2$, and a solvent, and performing a heat treatment after applying the solution to obtain the layer including nickel hydroxide.

6. The method according to claim 5, wherein the layer including nickel hydroxide is a hole injection layer, and forming the light-emitting element further includes forming a hole transport layer between the hole injection layer and the light-emitting laver.

7. The method according to claim 5, wherein in forming the layer including nickel hydroxide, applying the solution, and performing the heat treatment after applying the solution, are performed a plurality of times, and the layer including nickel hydroxide is formed as a layered body comprising a plurality of layers.

8. The method according to claim 7, wherein each of the plurality of layers forming the layered body is a thin film layer that is made of nickel hydroxide, and that has a film thickness equal to or less than 50 nm.

9. A method of manufacturing a display device, the method comprising:

forming a thin film transistor layer on a substrate; and forming a light-emitting element on the thin film transistor layer, the light-emitting element including an anode, a cathode, and a light-emitting layer provided between the anode and the cathode, wherein:

forming the light-emitting element includes forming a layer including nickel hydroxide between the anode and the light-emitting layer, and forming the layer including nickel hydroxide includes:

applying a solution including nickel acetate $Ni(OCOCH_3)_2$ and a solvent, and performing a heat treatment at a temperature equal to or higher than 100° C. and lower than 300° C.

after applying the solution to obtain the layer including nickel hydroxide.

10. The method of manufacturing the display device according to claim 9, wherein the layer including nickel hydroxide is a hole injection layer, and forming the light-emitting element further includes forming a hole transport layer between the hole injection layer and the light-emitting layer.

11. The method of manufacturing the display device according to claim 9, wherein performing the heat treatment after applying the solution includes a first heat treating and a second heat treating that is performed after the first heat treating, the first heat treating is performed at a heat treatment temperature equal to or higher than 100° C. and equal to or lower than 180° C., and the second heat treating is performed at a heat treatment temperature equal to or higher than 230° C. and lower than 300° C.

12. The method of manufacturing the display device according to claim 11, wherein the first heat treating is performed for a time period equal to or more than 5 minutes and equal to or less than 30 minutes, and the second heat treating is performed for a time period equal to or more than 15 minutes and equal to or less than 1 hour.

* * * * *